US010770260B2

(12) United States Patent
Otani et al.

(10) Patent No.: US 10,770,260 B2
(45) Date of Patent: Sep. 8, 2020

(54) DEFECT OBSERVATION DEVICE

(71) Applicant: HITACHI HIGH-TECHNOLOGIES CORPORATION, Tokyo (JP)

(72) Inventors: Yuko Otani, Tokyo (JP); Yohei Minekawa, Tokyo (JP); Takashi Nobuhara, Tokyo (JP); Nobuhiko Kanzaki, Tokyo (JP); Takehiro Hirai, Tokyo (JP); Miyuki Fukuda, Tokyo (JP); Yuya Isomae, Tokyo (JP); Kaori Yaeshima, Tokyo (JP); Yuji Takagi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/260,988

(22) Filed: Jan. 29, 2019

(65) Prior Publication Data

US 2019/0237296 A1 Aug. 1, 2019

(30) Foreign Application Priority Data

Jan. 30, 2018 (JP) .................................. 2018-013472

(51) Int. Cl.
| | |
|---|---|
| *G02B 21/18* | (2006.01) |
| *H01J 37/22* | (2006.01) |
| *G06T 7/13* | (2017.01) |
| *G06T 7/60* | (2017.01) |
| *G02B 21/00* | (2006.01) |
| *G02B 21/36* | (2006.01) |

(Continued)

(52) U.S. Cl.
CPC ........ *H01J 37/222* (2013.01); *G02B 21/0016* (2013.01); *G02B 21/18* (2013.01); *G02B 21/365* (2013.01); *G02B 21/367* (2013.01); *G06T 7/0004* (2013.01); *G06T 7/13* (2017.01); *G06T 7/60* (2013.01); *G06T 7/73* (2017.01); *H01J 37/28* (2013.01); *G06T 2207/10056* (2013.01); *G06T 2207/10061* (2013.01); *G06T 2207/30148* (2013.01); *H01J 2237/2448* (2013.01); *H01J 2237/2482* (2013.01); *H01J 2237/2806* (2013.01); *H01J 2237/2817* (2013.01)

(58) Field of Classification Search
CPC ... G01N 21/9501; G01N 21/956; H01J 37/28; H01J 37/222; G06T 2207/30148; G06T 2207/10061; G06T 7/13; G06T 7/60; G06T 7/73; G06T 7/0004; G02B 21/0016; G02B 21/367; G02B 21/18; G02B 21/365
See application file for complete search history.

(56) References Cited

U.S. PATENT DOCUMENTS

| | | | |
|---|---|---|---|
| 2005/0045821 A1* | 3/2005 | Noji | G01N 23/225 250/311 |
| 2008/0073524 A1* | 3/2008 | Nishiyama | G01N 23/225 250/307 |

(Continued)

FOREIGN PATENT DOCUMENTS

JP 2012-127848 A 7/2012

*Primary Examiner* — David E Harvey
(74) *Attorney, Agent, or Firm* — Volpe and Koenig, P.C.

(57) ABSTRACT

A defect observation device detects a defect with high accuracy regardless of a defect size. One imaging configuration for observing an observation target on a sample is selected from an optical microscope, an optical microscope, and an electron microscope, and an imaging condition of the selected imaging configuration is controlled.

14 Claims, 15 Drawing Sheets

(51) Int. Cl.
  *G06T 7/00*   (2017.01)
  *H01J 37/28*  (2006.01)
  *G06T 7/73*   (2017.01)

(56) References Cited

U.S. PATENT DOCUMENTS

| | | | |
|---|---|---|---|
| 2009/0002695 A1* | 1/2009 | Saito | G01N 21/8806 356/237.4 |
| 2010/0194874 A1* | 8/2010 | Bierhoff | H01J 37/20 348/80 |
| 2013/0277553 A1* | 10/2013 | Otani | G01N 21/8806 250/307 |
| 2015/0214000 A1* | 7/2015 | Hirai | H01J 37/22 382/141 |
| 2016/0211112 A1* | 7/2016 | Nakao | H01J 37/226 |
| 2018/0088306 A1* | 3/2018 | Suzuki | H01J 37/28 |

* cited by examiner

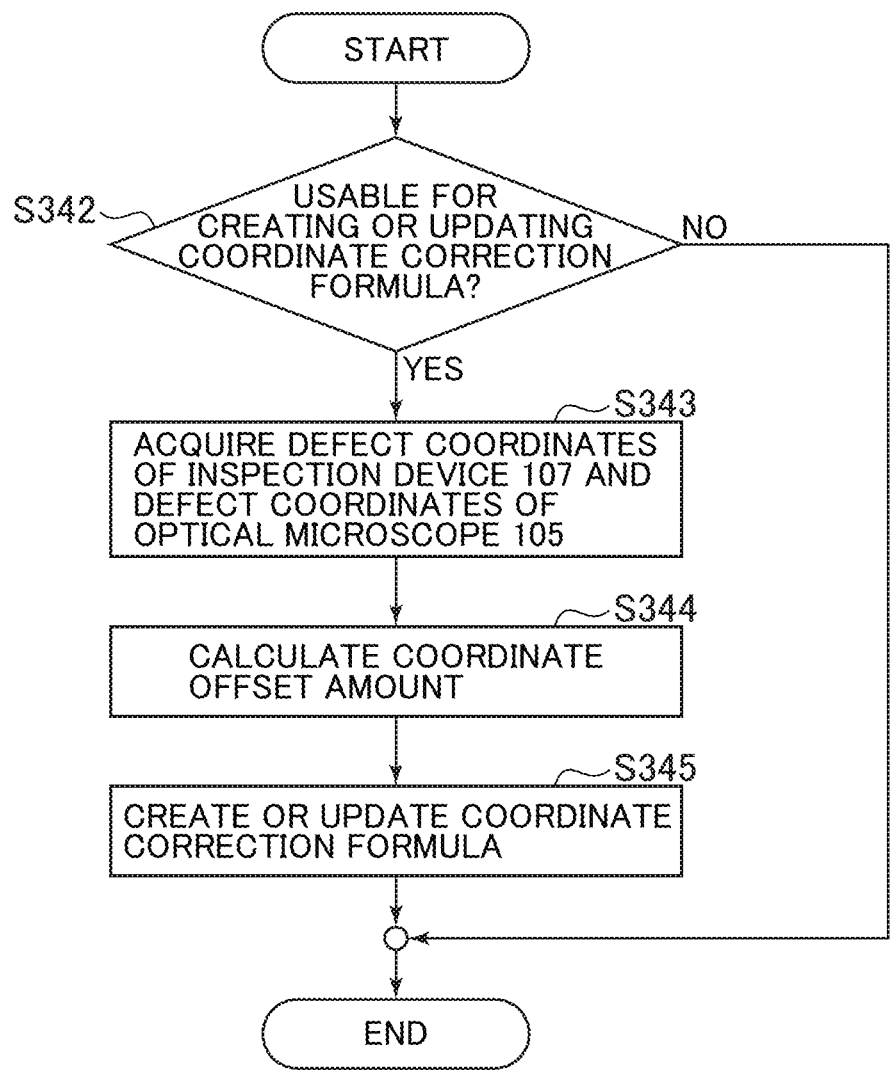

FIG. 11

DETAILS SETTING

| | |
|---|---|
| HIGH ACCURACY COORDINATE ALIGNMENT | ● EFFECTIVE ○ INEFFECTIVE |

• IMAGING CONFIGURATION OF OPTICAL MICROSCOPE TO BE USED

| | |
|---|---|
| CONFIGURATION A | ● EFFECTIVE ○ INEFFECTIVE |
| CONFIGURATION B | ● EFFECTIVE ○ INEFFECTIVE |
| USE ILLUMINATION MODE | ☑ LASER ☑ WHITE LIGHT SOURCE |

| | |
|---|---|
| COORDINATE CORRECTION FORMULA CREATION | ● EFFECTIVE ○ INEFFECTIVE |
| DEFECT SAMPLING METHOD | ● METHOD I ○ METHOD II |
| DEFECT EXCLUDED AT TIME OF CREATING COORDINATE CORRECTION FORMULA | ☑ LINEAR DEFECT  ☑ MULTIPLE DEFECTS IN SAME FIELD OF VIEW  ☑ LARGE DEFECT  [100 ▾] nm over |

• INITIAL CONDITION SETTING

| CONFIGURATION B LASER | CONFIGURATION B WHITE LIGHT SOURCE | CONFIGURATION A | SEM |
|---|---|---|---|
| FILTER | ● ABSENT  ○ PRESENT | | |
| SHUTTER SPEED | [1/30 ▾] sec. | | |
| ILLUSTRATION INTENSITY | ‹ › 0 ▬▬▬▬▬▬ 100% | | |
| DEFECT SEARCH MAXIMUM RANGE | [5 x 5 ▾]  [500.00] μm | | |

• AUTOMATIC SETTING PARAMETER

IMAGING SYSTEM AUTOMATICALLY SET
☑ CONFIGURATION B LASER   ☑ CONFIGURATION B WHITE LIGHT SOURCE
☐ CONFIGURATION A   ☑ SEM

| CONFIGURATION B LASER | CONFIGURATION B WHITE LIGHT SOURCE | CONFIGURATION A | SEM |
|---|---|---|---|
| FILTER | ● AUTOMATIC ○ FIXED | | |
| SHUTTER SPEED | ● AUTOMATIC ○ FIXED | | |
| ILLUSTRATION INTENSITY | ○ AUTOMATIC ● FIXED | | |

DEFECT OBSERVATION DEVICE

BACKGROUND

The present invention relates to a defect observation device.

In a manufacturing process for a semiconductor device, if a foreign matter or a pattern defect such as a short circuit or a disconnection (hereinafter the foreign substance and the pattern defect are called "defect") exists on a wafer which is a semiconductor substrate, a failure such as an insulation failure or a short circuit of wiring occurs. Since those defects are mixed in the wafer due to various causes attributable to a manufacturing process, it is important to detect the defects generated during the manufacturing process at an early stage, to identify a generation source, and to prevent a decrease in yield for mass production of the semiconductor device.

A method widely operated for identifying the defect cause will be described. First, a defect inspection device identifies a defect position on the wafer, observes and classifies a corresponding defect based on coordinate information on the identified defect position in detail, and compares the observed and classified defect with database to estimate the defect cause.

An SEM (Scanning Electron Microscope) is mainly used for defect observation. However, since there is a deviation between a coordinate system of the SEM and coordinate systems of other inspection devices, the defect observation device is equipped with the SEM and an optical microscope for coordinate alignment.

The optical microscope mounted on the defect observation device again inspects a defect detected by another inspection device to correct the coordinate information, and observes the defect in detail based on the corrected coordinate information. This makes it possible to correct the deviation of the coordinate system, improve a success rate of defect observation, and maintain a high throughput.

Japanese Unexamined Patent Application Publication No. 2012-127848 discloses a technique of shortening a time required for searching an SEM optical condition suitable for the defect observation and improving the throughput. More specifically, an initial optical condition of the defect observation device is set with the use of the inspection results of other defect inspection devices.

SUMMARY

The pattern formed on the wafer is more miniaturized with the high integration of the semiconductor device, and a minimum defect size fatal to the semiconductor device is also micronized and miniaturized of the minimum. As a result, a defect size range to be detected by the defect observation device is enlarged, and there is a need to perform multiple inspections with different sensitivities for the purpose of calculating the defect coordinates with high precision without depending on a defect size.

In Japanese Unexamined Patent Application Publication No. 2012-127848, imaging conditions of an optical microscope equipped with the defect observation device are set based on the inspection result of another defect inspection device. However, since a minute defect is detected while maintaining a high throughput, a large defect having a certain size or more is deteriorated in coordinate precision. As a result, in Japanese Unexamined Patent Application Publication No. 2012-127848, it is difficult to detect the defect with a high accuracy irrespective of the defect size.

An object of the present invention is to detect a defect with a high accuracy irrespective of a defect size in a defect observation device.

A defect observation device according to one aspect of the present invention includes: a first imaging unit that captures a plurality of defects detected by an external inspection device; a control unit that corrects positional information on the defects by using an image captured by the first imaging unit; and a second imaging unit that captures the defects based on the corrected position information, in which the first imaging unit includes a plurality of imaging portions, the control unit selects one of the first imaging unit and the second imaging unit as a next imaging unit for each of the defects based on the information obtained by imaging the defect by the first imaging unit, the control unit sets a next imaging portion of the first imaging unit from the plurality of imaging portions in the first imaging unit or an imaging condition of the second imaging unit, the control unit sets an accumulation frame number, an acceleration voltage, a probe current, an imaging magnification or an imaging field of view as the imaging condition of the second imaging unit, and the control unit calculates a coordinate correction formula based on the positional information of the defect detected by the first imaging unit and the information obtained by an image acquired by the first imaging unit, and images the defect by using the second imaging unit based on the corrected positional information.

A defect observation device according to another aspect of the present invention includes: a first imaging unit that captures a plurality of defects detected by an external inspection device; a control unit that corrects positional information on the defects by using an image captured by the first imaging unit; and a second imaging unit that captures the defects based on the corrected position information, in which the first imaging unit includes a plurality of imaging portions, when it is determined that coordinate detection of the defect from the image captured by the first imaging unit is disabled, the control unit sets a next imaging portion of the first imaging unit from the plurality of imaging portions of the first imaging unit based on the information obtained by the image acquired by the first imaging unit of the imaging portion determined to be incapable of detecting the coordinates of the defect, and the control unit calculates a coordinate correction formula based on the positional information of the defect detected by the first imaging unit and information obtained by the image acquired by the first imaging unit, and images the defect by using the second imaging unit based on the corrected positional information.

According to one aspect of the present invention, the defect can be detected with a high accuracy irrespective of the defect size in the defect observation device.

BRIEF DESCRIPTION OF THE DRAWINGS

FIG. 10 is a flowchart showing a flow of a process for determining use or disuse in calculation of a coordinate correction formula according to the first embodiment;

FIG. 11 is a diagram showing a GUI screen for setting defect observation conditions according to the first embodiment;

DETAILED DESCRIPTION

Figure 1:
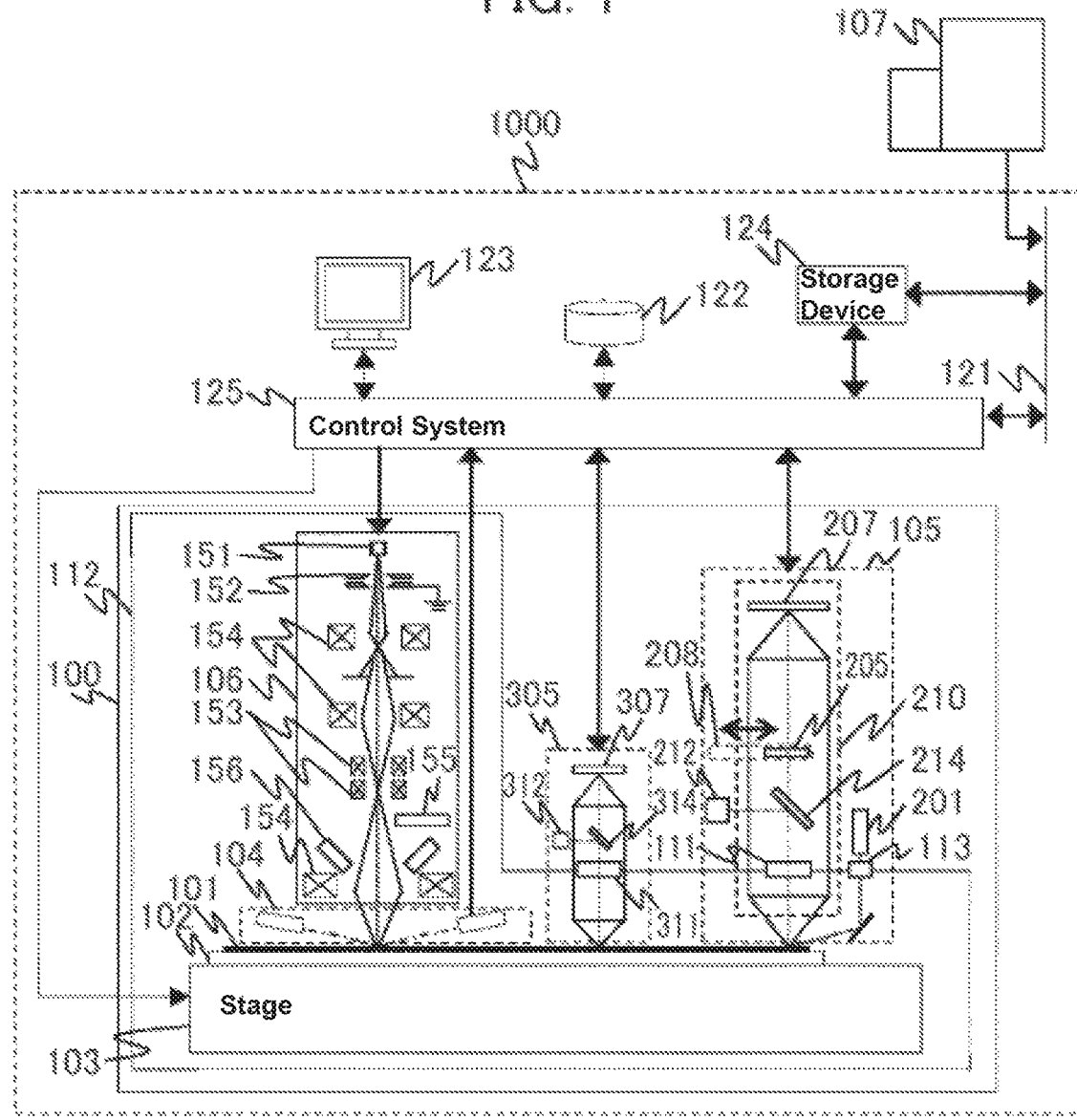
FIG. 1 is a block diagram showing an overall configuration of a defect observation device according to a first embodiment.

A pattern formed on a wafer is more miniaturized with a high integration of a semiconductor device, and a minimum defect size fatal to the semiconductor device is also micronized and miniaturized of the minimum. As a result, a defect size range to be detected by a defect observation device is enlarged, and there is a need to perform multiple inspections with different sensitivities for the purpose of calculating the defect coordinates with high precision without depending on a defect size. For example, in a maximum sensitivity mode, a scattered light amount of a large defect is large, and an optical microscope image of the defect becomes huge, and defect coordinates cannot be identified. On the other hand, in a low sensitivity mode, a microscopic defect cannot be detected. For that reason, the optical microscope equipped with the defect observation device is equipped with a plurality of optical configurations with different sensitivities and has a function to image the defect with sensitivity suitable for the target defect. However, a throughput is lowered by a condition search suitable for defect detection.

The defect observation device has a function of imaging several defects at the beginning with the optical microscope to calculate the defect coordinates and creating a coordinate correction formula for calculating an offset with respect to output coordinates of the defect detection device. There is a need to acquire the image of initial several images of the optical microscope in order to create the coordinate correction formula, but after the creation of the coordinate correction formula, the defect coordinates calculated from the coordinate correction formula are imaged by an SEM to realize high-speed defect observation.

However, a coordinate offset amount between the defect inspection device and the defect observation device depends on a type of the defect. For example, the large defect is poor in coordinate accuracy for both of the defect inspection device and the optical microscope equipped with the defect observation device. A defect having a large area such as a linear defect such as a scratch defect, a plurality of adjacent defects, or a large defect may have deviation in defect coordinates selected between the defect inspection device and the defect observation device.

When using a coordinate correction formula with low precision created using the defect with low coordinate alignment accuracy between the defect inspection device and the defect observation device, the defect does not fall within a field of view of the SEM and the throughput is lessened due to "search around" for searching the defects while imaging a periphery by the SEM.

An embodiment provides a defect observation device having a required defect detection sensitivity and a required throughput.

The defect observation device according to the embodiment is a defect observation device equipped with a plurality of imaging configurations including an optical microscope and an SEM, and selects one next imaging configuration from the plurality of imaging configurations based on information obtained by imaging a defect image with one of imaging configurations, and automatically sets an imaging condition of the next imaging configuration.

For example, the defect observation device according to the embodiment includes: an optical microscope for acquiring an optical microscopic image on a sample; a control unit for calculating coordinates of an observation target defect on the basis of the image acquired by the optical microscope; and an electron microscope for observing the observation target defect on the basis of the coordinates of the observation target defect calculated by the control unit. The optical microscope is an optical microscope capable of selecting a plurality of imaging portions, and the image acquired by the optical microscope is acquired by a next imaging portion automatically selected based on the information obtained when acquiring the image by a previous imaging portion.

According to the embodiment, the defect generated on a semiconductor wafer can be observed at a high speed and a high detection rate in a manufacturing process of a semiconductor device.

Hereinafter, embodiments will be described with reference to the accompanying drawings.

First Embodiment

FIG. 1 is a block diagram showing an overall configuration of a defect observation device according to a first embodiment.

A defect observation device 1000 includes an observation device 100, a network 121, a database 122, a user interface 123, a storage device 124, and a control system unit 125. In addition, the defect observation device 1000 is connected to a defect inspection device 107, which is another inspection device, through a network 121. The defect inspection device 107 detects a defect existing on a sample 101 and acquires defect information such as position coordinates and a size of the defect.

The defect information acquired by the defect inspection device 107 is input to the storage device 124 or the control system unit 125 through the network 121. The storage device 124 stores defect information acquired by the defect inspection device 107, which is input through the network 121. The control system unit 125 reads the defect information output from the defect inspection device 107 or the defect information stored in the storage unit 124, and controls the observation device 100 based on the read defect information. Then, the observation device 100 observes some or all of the defects detected by the defect inspection device 107 in detail, and performs classification of the defects, analysis of the defect cause, and the like.

Next, the configuration of the observation device 100 shown in FIG. 1 will be described.

In the following description, an optical microscope 105, an optical microscope 305, and an SEM 106 are referred to as an imaging configuration. In addition, illumination and detection parameters of each imaging configuration are referred to as imaging conditions. A configuration having the same imaging configuration and the same imaging condition is referred to as the same imaging portion, and a configuration having a different imaging configuration or a different imaging condition in the same imaging configuration is referred to another imaging portion.

The optical microscopes 105 and 305 configure, for example, a first imaging unit. The first imaging unit images multiple defects detected by an external defect inspection device 107. The SEM 106 configures, for example, a second imaging unit. The second imaging unit images a defect based on positional information corrected with the use of the image captured by the first imaging unit. The first imaging unit includes multiple imaging portions (for example, the optical microscope 105 and the optical microscope 305).

As shown in FIG. 1, the observation device 100 includes, for example, a drive unit including a sample holder 102 and a stage 103, an optical height detector 104, the two optical microscopes 105 and 305, the SEM 106 (electron microscope unit), a laser displacement meter (not shown), and a vacuum chamber 112.

The sample 101 is placed on the sample holder 102 installed on a movable stage 103. The stage 103 moves the sample 101 placed on the sample holder 102 between the optical microscope 105 and the SEM 106. With the movement of the stage 103, an observation target defect present in the sample 101 can be moved within a field of view of the SEM 106 or into a field of view of the optical microscopes 105 and 305.

The optical height detector 104 measures a height position of a surface of the observation target area of the sample 101. The height information on the sample 101 measured by the optical height detector 104 is output to the control system 125, and fed back to a focal position adjustment operation sequence of the microscope 105, 305 or the SEM 106.

The optical microscope 105 includes a laser illumination optical system 201, a white illumination optical system 211, a detection optical system 210, and a height control mechanism (not shown). The laser illumination optical system 201 includes a laser light source (not shown), a beam shaping lens system (not shown), an illumination optical filter (not shown), and a condenser lens (not shown).

A light beam emitted from a laser light source is converted into a collimated light having a beam diameter of a circle or an elliptical shape having a size suitable for a condensing spot size on the sample 101 through the beam shaping optical system. The collimated light is condensed and illuminated on the sample 101 through the illumination optical filter and the condenser lens. Alternatively, the collimated light may be converged illuminated on the sample 101 with only the condenser lens without passing through the illumination optical filter.

The illumination optical filter is disposed on an optical axis of the laser illumination optical system 201 and controls a light intensity of transmission of the light emitted from the laser light source or controls a deflection direction of the light. The illumination optical filter is formed of an ND filter, a wavelength plate, or the like. The illumination optical filter can be switchably disposed on the optical axis of the laser illumination optical system 201 or outside the optical axis by a switching mechanism (not shown). In addition, in the case of providing a mechanism for switching some lenses among multiple lenses configuring the beam shaping lens system to lenses having different focal lengths, a convergence size change of the illumination light on the sample 101 can be realized. The switching of the illumination optical filter, the switching of the illumination intensity of the laser light source and the switching of the beam shaping lens system are controlled by the control system 125.

The white illumination optical system 212 includes a white light source (not shown), an illumination lens (not shown), a half mirror 214, and an objective lens (not shown). The white illumination light emitted from the white light source is converted into a collimated light by the illumination lens. A part of the collimated light is turned by the half mirror 214 in a direction parallel to the optical axis of the detection optical system 210, and condensed and irradiated on the sample 101 by the objective lens. The illumination intensity of the white light source is controlled by the control system 125.

The detection optical system 210 includes the objective lens, a lens system (not shown), an optical filter 205, an imaging lens (not shown), and a detector 207. A reflected and scattered light generated from an area to be illuminated on the sample 101 by the illumination light irradiated from the laser illumination optical system 201 or the white illumination optical system 212 is condensed by the objective lens, and focused on the detector 207 through a lens system and an imaging lens.

The imaged light is converted into an electric signal and output to the control system unit 125 by the detector 207. The signal output from the detector 207, which is processed by the control system unit 125, is stored in the storage unit 124. The stored processing result is displayed through the user interface 123. The optical filter 205 is disposed on the optical axis of the detection optical system 210. The optical filter 205 performs a light shielding by masking, a control of a transmittance of the transmitted light, or a control or selection of a deflection direction of the transmitted light, with respect to the light condensed by the objective lens. The optical filter 205 is, for example, an ND filter, a spatial filter, a polarizer, a wave plate, a spatial distribution optical element, and so on. The spatial distribution optical element is disclosed in, for example, Japanese Unexamined Patent Application Publication No. 2012-127848.

The detector 207 includes a two-dimensional CCD sensor, a line CCD sensor, a TDI sensor group in which multiple TDIs are disposed in parallel, a photodiode array, and so on. The detector 207 is disposed such that a sensor surface of the detector 207 conjugates with a surface of the sample 101 or a pupil plane of the objective lens. A switching mechanism 208 places one optical filter 205 suitable for a target defect from the multiple optical filters 205 having different optical features on the optical axis of the detection optical system 210.

A dummy substrate that changes an optical path length having the same length as that of the optical filter 205 may be disposed on the optical axis of the detection optical system 210. The switching mechanism 208 can also switch between the optical filter 205 and the dummy substrate. The switching of the optical filters and the detector 207 are controlled by the control system 125.

The height control mechanism adjusts a focal point of the detection optical system 210 on the observation target surface on the sample 101 in accordance with a command from the control system 125. Examples of the height control mechanism include a linear stage, an ultrasonic motor, a piezoelectric stage, and so on.

Like the optical microscope 105, the optical microscope 305 includes a white illumination optical system 311, a detection optical system (not shown), and a height control mechanism (not shown). The white illumination optical system 311 includes a white light source (not shown), an illumination lens (not shown), a half mirror 314, and an objective lens (not shown) similarly to the white illumination optical system 211. The illumination intensity of the white light source is controlled by the control system 125.

The detection optical system includes the objective lens (not shown) and the detector 307. The reflected and scattered light generated from the area to be illuminated on the sample 101 by the illumination light irradiated from the white illumination optical system 312 is condensed by the objective lens, and focused on the detector 307 through the imaging lens. The imaged signal is converted into the electric signal by the detector 307 and output to the control system unit 123. The signal output from the detector 207, which is processed by the control system unit 125, is stored in the storage unit 124. The stored processing result is displayed through the user interface 123. The height control mechanism adjusts a focal point of the detection optical system 210 on the observation target surface on the sample 101 in accordance with a command from the control system 125.

The SEM 106 includes an electron beam irradiation system having an electron beam source 151, an extraction electrode 152, a deflection electrode 153, and an objective lens electrode 154, and an electron detection system having a secondary electron detector 155 and a reflected electron detector 156. Primary electrons are emitted from the electron beam source 151 of the SEM 105, and the emitted primary electrons are extracted onto the beam by the extraction electrode 152 and accelerated.

Further, a trajectory of the primary electron beam accelerated by the deflection electrode 153 is controlled in an X direction and a Y direction by the objective lens electrode 154. The primary electron beam whose trajectory is controlled by the objective lens electrode 154 is converged and irradiated on the surface of the sample 101, and scanned over the sample 101. Secondary electrons and reflected electrons are generated from the surface of the sample 101 irradiated and scanned with the primary electron beam. The generated secondary electrons are detected by the secondary electron detector 155. Electrons of relatively high energy such as the reflected electrons are detected by the reflected electron detector 156.

A shutter (not shown) disposed on the optical axis of the SEM 106 selects start or stop of irradiation of the electron beam irradiated from the electron beam source 151 onto the sample 101. The measurement conditions of the SEM 106 are controlled by the control system unit 125 so as to be able to change an accelerating voltage, a focus of the electron beam, an observation magnification, the number of accumulated frames, and so on. The SEM 106 detects the defect in detail based on information obtained from the image captured by the optical microscope 105 or 305. A general defect observation flow is disclosed in Japanese Unexamined Patent Application Publication No. 2012-127848.

The laser displacement meter measures a position of the stage 103. A positional information of the stage 103 measured by the laser displacement system is output to the control system unit 125 and fed back to an operation sequence of the stage 103.

The drive unit and the respective objective lenses of the optical microscopes 105 and 305, the SEM 106, and the laser displacement meter are placed in the vacuum chamber 112. The vacuum chamber 112 is provided with vacuum sealing windows 111, 113, and 311 for transmitting the illumination light and the reflected and scattered light of the optical microscopes 105 and 305 while maintaining a vacuum.

The control system 125 is connected to the stage 103, the optical height detector 104, the optical microscopes 105 and 305, the SEM 106, the laser displacement meter, the user interface 123, the database 122, and the storage device 124. The control system 125 controls the movement of the stage 103, the measurement conditions of the optical height detector 104, focal heights of the optical microscopes 105, 305 and the SEM 106, the respective imaging conditions of the optical microscopes 105 and 305, the imaging condition of the SEM 106, the operation and the input and output of each configuration.

Further, the control system 125 selects one imaging configuration for observing an observation target on the sample 101 from the optical microscope 105, the optical microscope 305, and the SEM 106, and controls the imaging conditions of the selected imaging configuration. For example, the imaging conditions when the optical microscope 105 is selected as the imaging configuration include an illumination mode (the laser illumination optical system 201 or the white illumination optical system 212), an intensity of the illumination light source, a presence or absence of the illumination filter, a shutter speed and a gain of the detector 207, and a presence or absence of the optical filter.

For example, the imaging conditions when the optical microscope 305 is selected as the imaging configuration include the intensity of the illumination light source, the shutter speed and the gain of the detector 307, and so on. For example, the imaging conditions when the SEM 107 is selected as the imaging configuration include the accelerating voltage, a scanning range and a scanning speed of the electron beam, and the number of integrated frames configuring the SEM image. In addition, the control system 125 is connected to a host system (for example, the defect inspection device 107) through the network 121.

The control system 125 reads the defect information output by the defect inspection device 107 or the defect information stored in the storage device 124, and controls the stage 103 so that the defect to be observed falls within a field of view of the optical microscope 105 or the optical microscope 305 based on the read defect information. The control system 125 calculates a defect coordinate deviation between the defect inspection device 107 and the defect observation device 1000 based on the image detected by the optical microscope 105 or the optical microscope 305, and corrects the defect coordinate information stored in the storage device 124.

Figure 2:
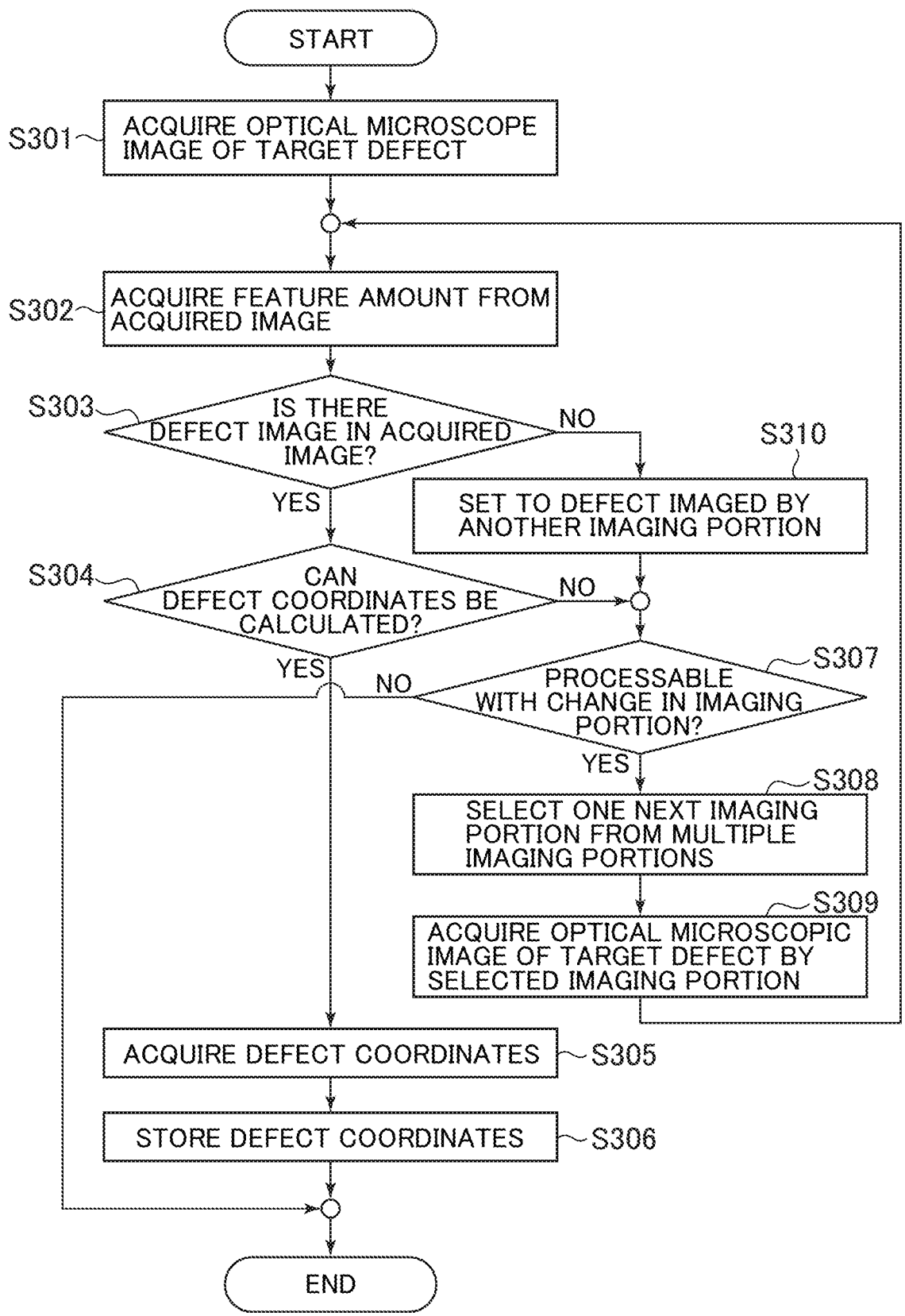
FIG. 2 is a flowchart showing a flow of a defect detection process according to the first embodiment.

FIG. 2 is a flowchart from the defect detection to the coordinate storage using the optical microscope 105 or 305 according to the first embodiment.

The defect information of the sample 101 output from the external defect inspection device 107 is read and the defect observation is performed by the defect observation device 1000 based on the defect information. In the defect observation, first, the sample 101 is placed on the sample holder 102 of the defect observation device 1000. A feature region of the sample 101 is illuminated by the white illumination optical system 211 of the optical microscope 105 and observed by the detection optical system 210. Alternatively, the feature region of the sample 101 is observed by the optical microscope 305 to perform a coarse alignment of the sample 101. The feature region of the sample 101 includes, for example, an outer peripheral portion, a periphery of the outer peripheral portion, a notch portion, and the like.

Next, the stage 103 is moved so that the observation target defect fall within the field of view of the optical microscope based on the defect information on the sample 101 output by the external defect inspection device 107 and the coarse alignment result. The objective lens of the optical microscope is moved by the control mechanism, and the focus of the optical microscope is adjusted on the sample 101.

Then, an image of the periphery of the observation target region is acquired with the optical microscope (S301), and an image feature amount is acquired from the acquired image (S302). It is determined whether a defect image is present in the acquired image, or not, based on the acquired image feature amount (S303). If the defect image is present in the acquired image (YES in S303), it is determined whether or not defect coordinates can be calculated based on the imaging portion information of the optical microscope in S301 and the image feature amount acquired in S302 (S304). If the defect coordinates can be calculated (YES in S304), the defect coordinates are calculated based on the image feature amount acquired in S 302 (S305), and the acquired defect coordinates are stored in the storage device 124 (S306).

Figure 3:
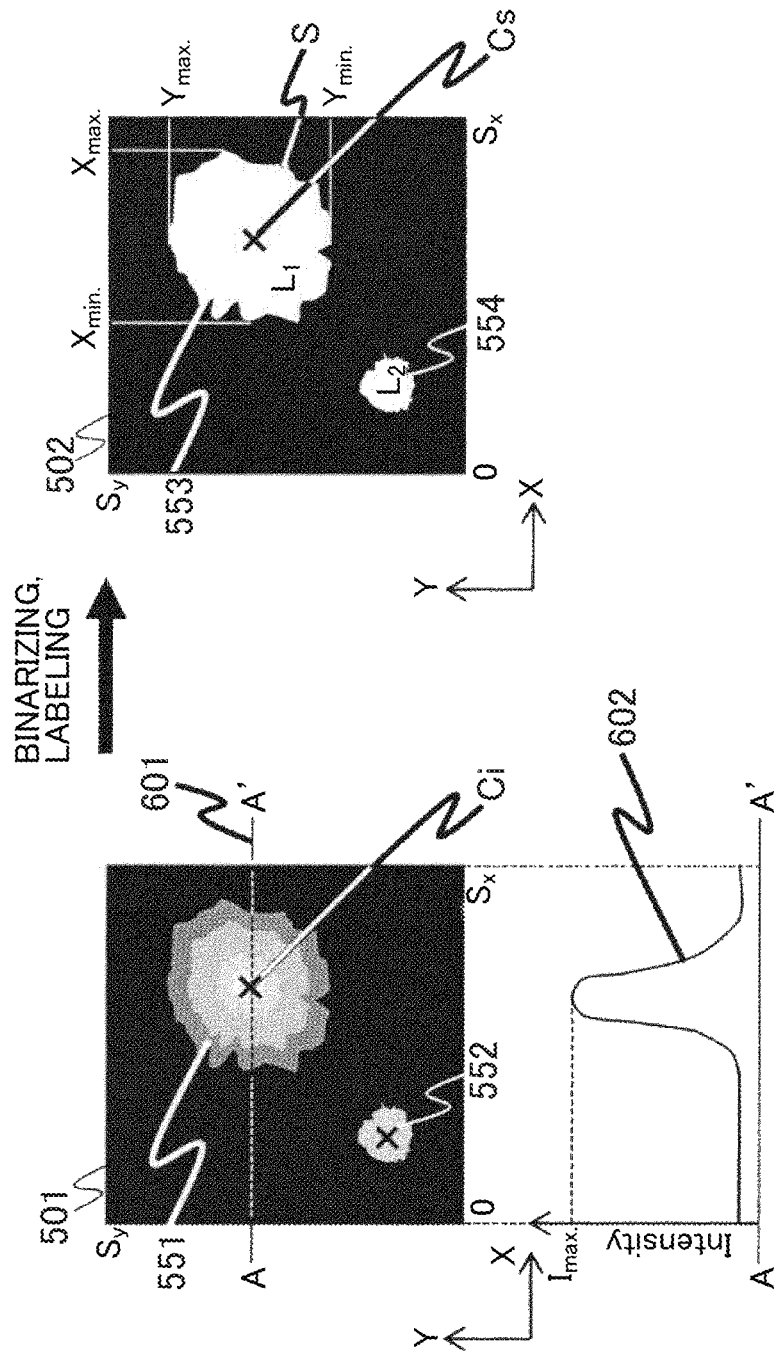
FIG. 3 is an illustrative diagram of a feature amount obtained from an image captured by a previous imaging unit according to the first embodiment.

FIG. 3 shows an example of the image feature amount.

An image 501 shows an image acquired by the optical microscope 105 or 305, an image 502 shows an image obtained by binarizing the image 501, images 551 and 552 show defect images before binarization, and images 553 and 554 show binarized defect images. The image 501 may be an image obtained by performing a smoothing process such as a median filter or an edge enhancement process such as a Sobel filter on the image acquired by the optical microscope. A line 602 denotes a luminance value on a cross-sectional line 601 taken along a line A-A' in the image 501.

For example, the image feature amount is, for example, a maximum luminance $I_{max}$ in the image 501, a luminance center of gravity Ci of the defect images 551 and 502, an area S of the defect image, maximum coordinates ($X_{max}$, $Y_{max}$) of the defect image, minimum coordinates ($X_{min}$, $Y_{min}$) of the defect image, an area center of gravity Cs of the defect image, labels $L_1$ and $L_2$ attached to the defect image by a labeling process of the image 502, and the like.

The imaging portion information of the optical microscope in S301 includes, for example, information on the imaging configuration of the optical microscope 105 or 305 for imaging a target defect on the sample 101, and information on the imaging conditions in the imaging configuration of the optical microscope. In the case of using the optical microscope 105, the imaging conditions include information on, for example, a type of the illumination light source, the shutter speed and gain of the detector 207, ON or OFF of the optical filter 205, and so on. The type of the illumination light source is, for example, the laser illumination optical system 201 or the white illumination optical system 212.

On the other hand, when it is difficult to calculate the defect coordinates with the image feature amount obtained in S302 (NO in S304), it is determined whether or not there is a possibility of calculation of the defect coordinates by another imaging portion of the optical microscope based on S304 (S307). If there is a possibility that the defect coordinates can be calculated by another imaging portion (YES in S307), one next imaging portion is selected from the plural imaging portions based on S304 (S308), and the image of the target defect is acquired with the selected imaging portion (S309).

Then, the process returns to the above-described procedure (S302) for detecting the defect, and the process advances. If the defect coordinates are difficult to calculate by the optical microscope (NO in S307), the defect coordinate calculation process is terminated. A case where the defect coordinates are difficult to calculate includes a case where the calculation of the coordinates is impossible, or a case where the coordinates can be calculated but the coordinate accuracy is extremely low.

If there is no defect image in the acquired image (NO in S303), the defect is set as a defect to be imaged by another imaging portion (S310). When the imaging portion can be set in S310 (YES in S307), the set imaging portion is selected (S308), and the image of the target defect is acquired with the selected imaging portion (S309).

Then, the process returns to the above-described procedure (S302) for detecting the defect, and the process advances. In that case, another imaging portion is, for example, an imaging portion having an imaging configuration different from the current imaging portion, or an imaging portion in which the imaging area of the optical microscope is changed. When the current imaging portion is the optical microscope 105, another imaging portion is an imaging portion having a long shutter speed of the detector 207, a high gain of the detector 207, and the optical filter 205 changed from OFF to ON as compared with the current imaging portion. In the case of changing the imaging area, there is a method of setting a maximum value of an imaging area change range by recipe in advance. On the other hand, if the imaging portion cannot be set in S310 (NO in S307), the defect coordinate calculation process is terminated.

Figure 4:
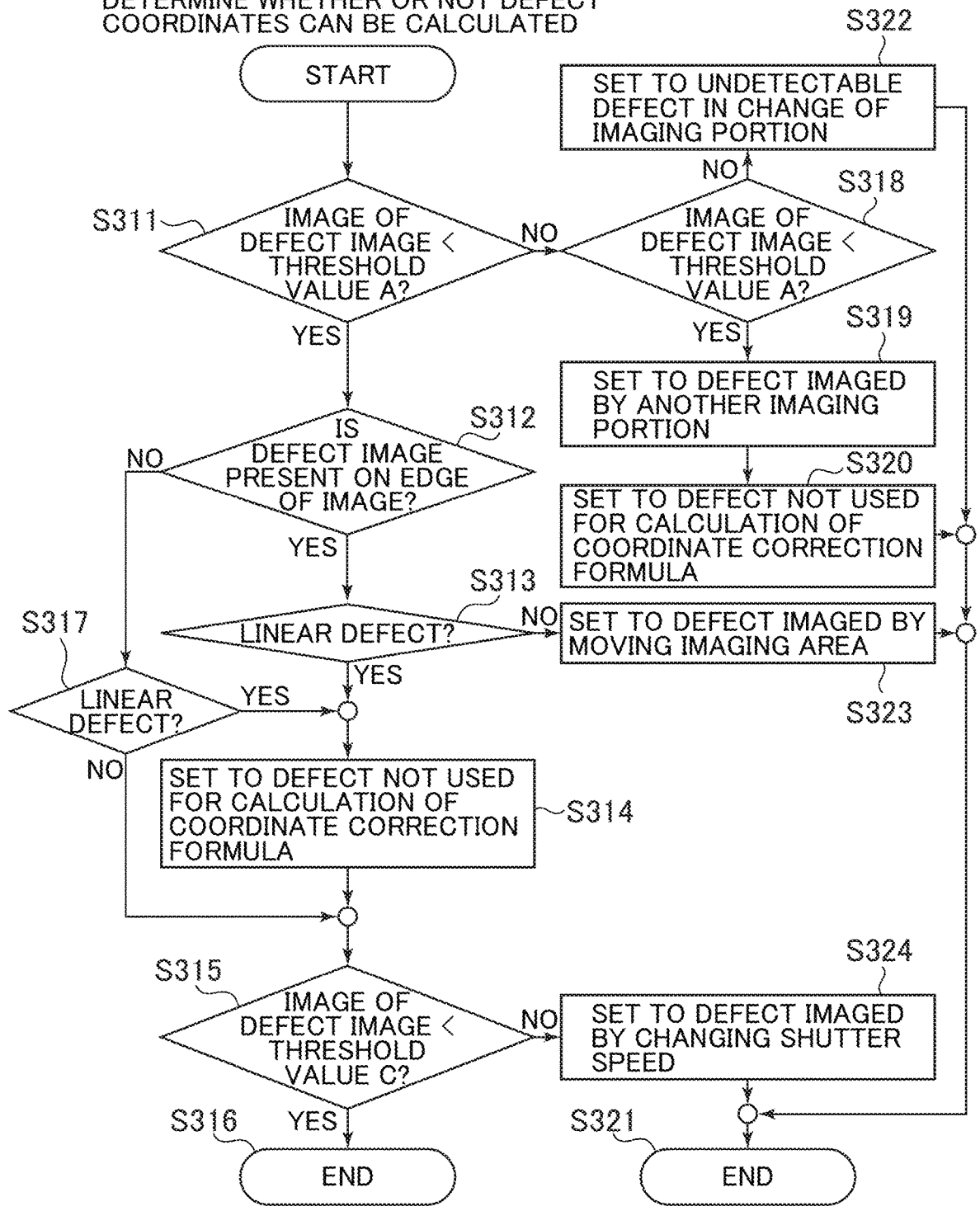
FIG. 4 is a flowchart showing a flow of a defect calculation possibility determination process according to the first embodiment.

FIG. 4 shows an example of a process of determining whether or not the defect coordinates can be calculated in the above S304 (FIG. 2).

In FIG. 4, a defect in which an area S of the defect image is equal to or less than a threshold value A is a defect that may be detected by the current imaging portion, a defect which is more than the threshold value A and less than a threshold value B is a detect that may be detected by another imaging portion of the optical microscope, and a defect more than the threshold value B is a defect that is hardly detected by the optical microscope. In addition, as a range where the defect coordinate calculation accuracy can be maintained stably, the area S of the defect image is set to be equal to or less than a threshold value C. The defect in which the area S of the defect image, which is one of the image feature amounts acquired in S302, is equal to or less than the threshold value A (YES in S311), first determines whether or not the region of the defect image is present on an edge of the image (S312).

The determination method and the determination reason will be described later with reference to FIG. 6. When the defect image area is not present on the edge of the image (NO in S312), it is next determined whether or not the defect is a linear defect such as scratch or slip (S317). The determination method and the determination reason will be described later with reference to FIG. 7. When it is determined based on the defect image that the defect is not the linear defect (NO in S317), it is determined whether or not the area S of the defect image is less than or equal to the threshold value C (S315). When the area S of the defect image is less than or equal to the threshold value C (YES in S315), it is determined that the defect coordinates can be calculated with the current image feature amount (YES) (S316).

When the area S of the defect image is equal to or less than the threshold value A and more than the threshold value C (NO in S315), the shutter speed of the detector is set to be shorter than the current shutter speed and after the defect is set to a defect to be imaged again (S324), it is determined that the defect coordinates cannot be calculated (NO) (S321).

On the other hand, if the area of the defect image is not on the edge of the image but the defect is determined as the linear defect based on the defect image (YES in S317), the defect is set as a defect not used for calculation of the coordinate correction formula (S314), and thereafter the process advances in the same manner as that described above. The linear defect is not used for calculation of the coordinate correction formula since a variation range in the coordinate alignment amount between the defect inspection device 107 and the defect observation device 1000 is large.

When the defect image area is present on the edge of the image (YES in S312) and the defect image is the linear defect (YES in S313), the moved imaging area is not again imaged, but the defect is set as the defect not used for calculation of the coordinate correction formula (S314), and the process proceeds in the same manner as described above.

On the other hand, when the defect image that is not a linear defect is present on the edge of the image (NO in S313), after the imaging area of the optical microscope 105 is moved, and the defect is set as a defect to be again imaged (S323), it is determined that the defect coordinates cannot be calculated (NO) (S321). When the imaging area is moved, and the defect is set as a defect to be again imaged in S323, a next imaging area may be set. It is conceivable to shift the next imaging area set at that time in a direction of the edge of the image where the area of the defect image is present.

Two reasons why the process is progressed without again imaging the moved imaging area even when the defect image is present on the edge of the image in the linear defect in S313 will be described below. One reason is that when the linear defect is longer than the imaging area of the optical microscope 105, there is no state in which there is no defect image on the edge of the image. The other reason is that since only the SEM image of any area of the linear defect can be acquired, there is no need to calculate central coordinates of the defect.

If the area of the defect image is more than the threshold value A (NO in S311) and less than or equal to the threshold value B (YES in S318), the defect is set as a defect to be imaged again by another imaging portion (S319). Next, after the defect is set as a defect which is not used for calculation of the coordinate correction formula (S320), it is determined that the defect coordinates cannot be calculated (NO) (S321). The large defect is not used for calculation of the coordinate correction formula since the variation range of the coordinate alignment amount between the defect inspection device 107 and the defect observation device 1000 is large.

In that case, another imaging portion is an imaging portion changing the shutter speed and gain of the detector 207 or 307, and the ON/OFF of the optical filter 205, the type of the illumination light source in the case of the optical microscope 105, and so on from the current imaging portion. The type of the illumination light source is, for example, the laser illumination optical system 201 or the white illumination optical system 212.

When the area of the defect image is more than the threshold value B (NO in S318), the defect is set as a defect which cannot be detected in changing the imaging portion of the optical microscope 105 (S322), and it is determined that the defect coordinates cannot be calculated (NO) (S321).

Figure 5:
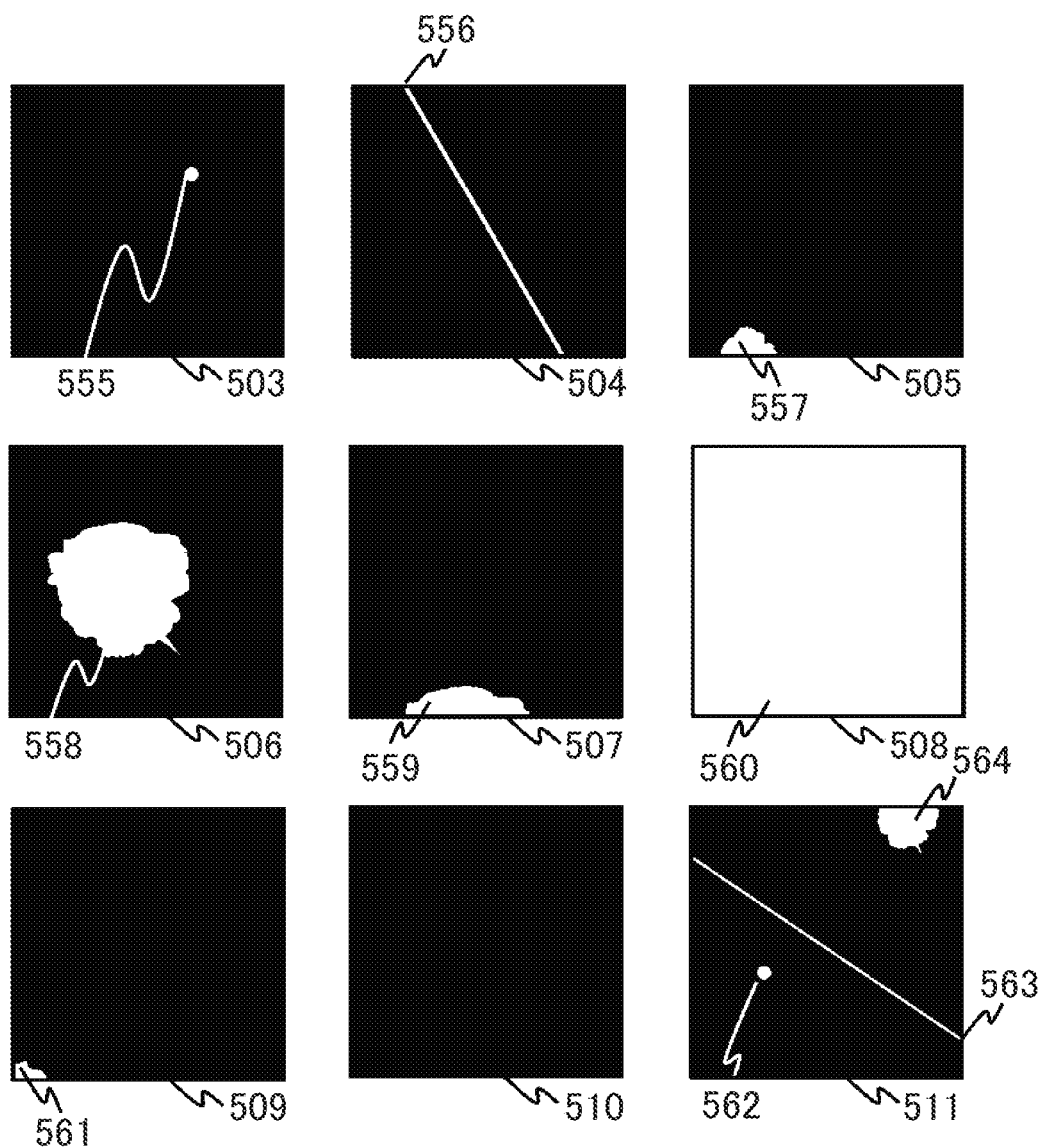
FIG. 5 is an illustrative diagram of an example of the captured image obtained by the previous imaging unit according to the first embodiment.

A flow of processing will be described with the use of captured image examples 503 to 511 acquired by the optical microscope 105 or 305 in FIG. 5. In this example, a magnitude of the threshold values of the defect area S satisfies threshold value C<threshold value A<threshold value B.

A defect image 555 in an image 503 is a minute defect image in which the defect area S is equal to or less than the threshold value C and the area of the defect image does not exist at the edge of the image. The defect image 555 is YES in S310, NO in S312, and YES in S315, it is determined that defect coordinates can be calculated (YES), and the defect coordinates are acquired (S305) and stored (S306) with the use of the image feature amount of the image 503.

A defect image 556 in an image 504 is a linear defect image in which the defect area S is equal to or less than the threshold value C and the area of the defect image is present on the edge of the image. The defect image 556 is YES in S311, YES in S312, and YES in S313, and sets to a defect not used for calculation of the coordinate correction formula (S314) and then becomes YES in S315. It is determined that the defect coordinates can be calculated (YES), and the defect coordinates are acquired (S305) and stored (S306).

A defect image 557 in an image 505 is a defect image in which the defect area S is equal to or less than the threshold value A and larger than the threshold value C and the area of the defect image is present on the edge of the image. The defect image 557 is YES in S311, YES in S312, and NO in S313, and is set as a defect to be imaged again by moving the imaging area of the optical microscope (S323). Then, it is determined that the defect coordinates cannot be calculated (NO) (S321). A direction of moving the imaging area set in S323 is a direction of the edge of the image in which the defect image is present. In the case of the image 557, the imaging area is shifted downward.

A defect image 558 in an image 506 is a defect image in which the defect area S is more than the threshold value A and equal to or less than the threshold value B and is not present on the edge of the image. The defect image 558 is NO in S311 and YES in S318, and is set to a defect imaged by another imaging portion (S139). In addition, after the defect image 558 is set to the defect not used for calculation of the coordinate correction formula (S320), it is determined that the defect coordinates cannot be calculated (NO) (S321). In that case, another imaging portion is lower in sensitivity than the current imaging portion so that the area A of the defect is equal to or less than the threshold value A. Thereafter, the processing is advanced in the same manner as that of the defect image 555 in the image 503, and the defect coordinates are acquired (S305) and stored (S306).

A defect image 559 in an image 507 shows a case where the defect image 558 in the image 506 is present on a boundary of the imaging area of the optical microscope. The defect image 559 is a defect image in which the defect area S is equal to or less than the threshold value A and more than the threshold value C. The defect image 559 is YES in S311, YES in S312, and NO in S314, and is set to a defect in which the imaging area of the optical scope is shifted (S323). In the case of the image 507, the imaging area is shifted downward where the defect 559 is stuck to the edge of the image 507.

Figure 7:
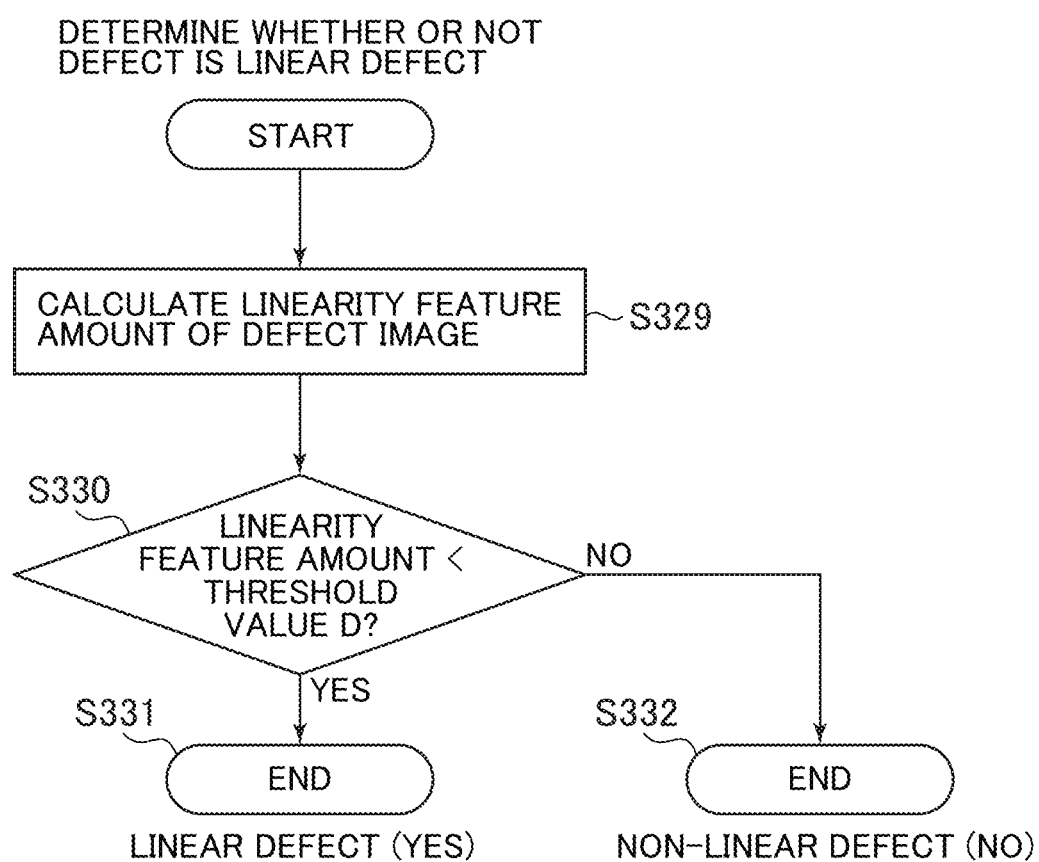
FIG. 7 is a flowchart showing a flow of a linear defect determination process according to the first embodiment.

Then, it is determined that the defect coordinates cannot be calculated (S321). If the imaging area set in S323 is an imageable area (S307), the image 506 is obtained through S308 and S309. The defect image 558 of FIG. 7 is subjected to the processing described above, and the defect coordinates are acquired (S305) and stored (S306).

A defect image 560 in an image 508 is a defect image in which the defect area S is more than the threshold value B and an area of the defect image is present on the edge of the image. The defect image 560 is NO in S311 and NO in S318, and is set to a defect whose defect coordinates are hardly calculated by changing the imaging portion of the optical microscope (S322). Then, it is determined that the defect coordinates cannot be calculated (S321). As a result, the defect image 560 is NO in S 303 and NO in S310 and S307, and the defect detection process is terminated.

A defect image 561 in an image 509 shows a captured image when the defect image 560 in the image 508 is present outside the imaging area of the optical microscope. The defect image 561 is a defect image whose defect area S is equal to or less than the threshold value C, and the defect area is present on the edge of the image. The defect image 561 is YES in S311, YES in S312, and NO in S313, and is set as a defect to be imaged again by moving the imaging area of the optical microscope 105 (S323).

In that case, a next imaging area is shifted from the current imaging area to a lower left direction. It is determined that the defect coordinates cannot be calculated (NO) (NO in S321 and S304). In S307, S308, and S309, the image 508 imaged again by shifting the imaging area of the optical microscope to the lower left is acquired. Thereafter, the above process is advanced to terminate the defect detection process as an undetectable defect.

In an image 510, no defect image can be detected. In that case, the image 510 is NO in S301, S302, and S303, and the defect or the imaging area imaged by another imaging portion higher in sensitivity than the current imaging portion is changed and set to the defect to be imaged (S310). When the imaging portion is increased in sensitivity and is set for the defect to be imaged again, and the imaging portion high in sensitivity can be set, the image 510 is YES in S307, and can be image again under a high-sensitivity imaging condition.

For example, in the case where the image again captured by another imaging portion is the image 503, the above process is progressed, and the defect coordinates are acquired (S305) and stored (S306). On the other hand, when another imaging portion higher in sensitivity than the current imaging portion is absent (NO in S307), the defect detection process is terminated assuming that the defect cannot be detected. In a case where the imaging area is changed and set as a defect to be imaged in S310, the imaging area of the optical microscope is moved, and the defect is again imaged. Thereafter, the processing described above is advanced. In the case where the defect image cannot be detected and the imaging area is moved and the defect is imaged again, there is a method of setting in advance a maximum value of the moving range of the imaging area by a recipe.

Figure 6:
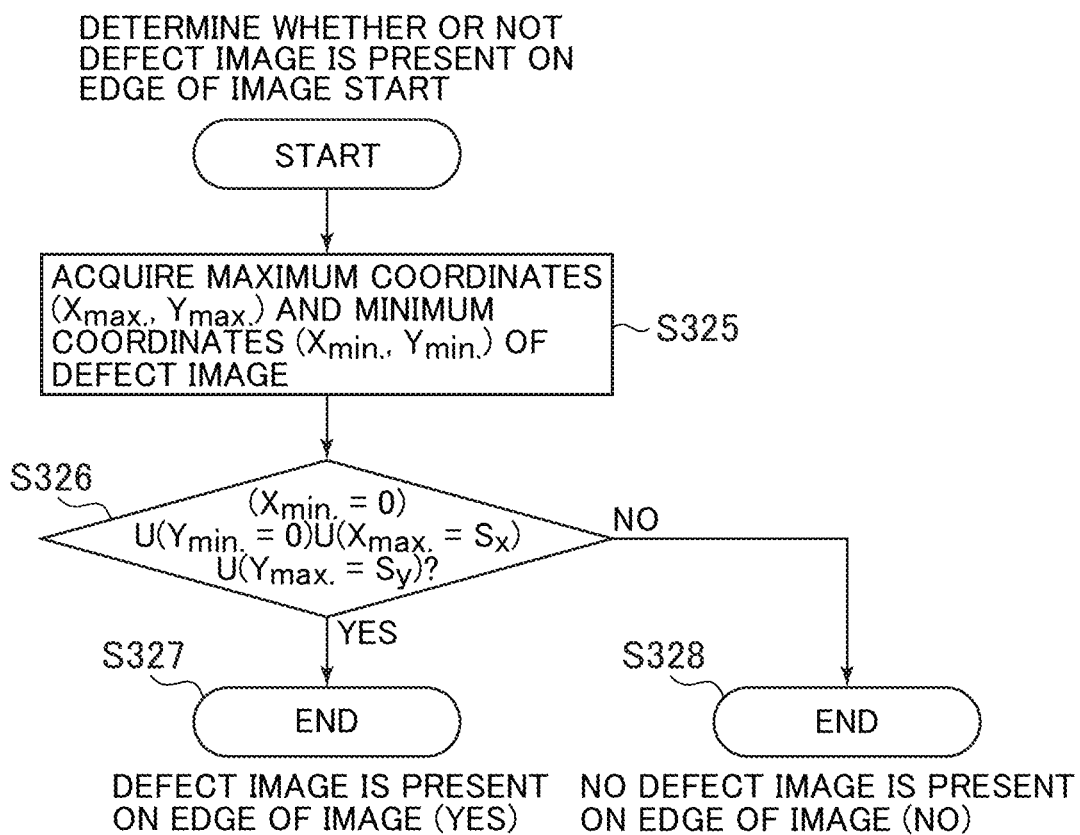
FIG. 6 is a flowchart showing a flow of a defect attachment determination process according to the first embodiment.

FIG. 6 shows an example of a process of determining whether or not a defect image in the image of S312 (FIG. 4) is present on the edge of the image.

It is assumed that an image size acquired by the detector 207 or 307 is $(S_x, S_y)$. The maximum coordinates $(X_{max.}, Y_{max.})$ and the minimum coordinates $(X_{min.}, Y_{min.})$ of the defect image calculated in S302 (FIG. 2) are acquired (S325). If $X_{min.}=0$, $Y_{min.}=0$, $X_{max.}=S_x$, or $Y_{max.}=S_y$ (YES in S326), it is determined that the area of the defect image is present on the edge of the image (YES) (S326). On the other hand, if $X_{min.}\neq0$, $Y_{min.}\neq0$, $X_{max.}\neq S_x$, and $Y_{max.}\neq S_y$ (NO in S326), it is determined that the area of the defect image is not present on the edge of the image (NO) (S328).

FIG. 7 shows an example of a process of determining whether or not the defect image in the image of S313 (FIG. 4) is a linear defect.

For example, a linear feature amount is acquired from the binarized image 502 acquired in S302 (FIG. 2) (S329). The linearity feature amount is, for example, the number of votes obtained by Hough transforming the binarized image 502, a ratio of a major axis to a minor axis of the defect image in the binary image 502, and so on. If the linearity feature quantity is more than the threshold value D (YES in S330), it is determined that the defect image in the image is a linear defect (YES) (S331). On the other hand, if the linearity feature quantity is equal to or less than the threshold value (NO in S330), it is determined that the defect image in the image is not the linear defect (NO) (S332).

Figure 8:
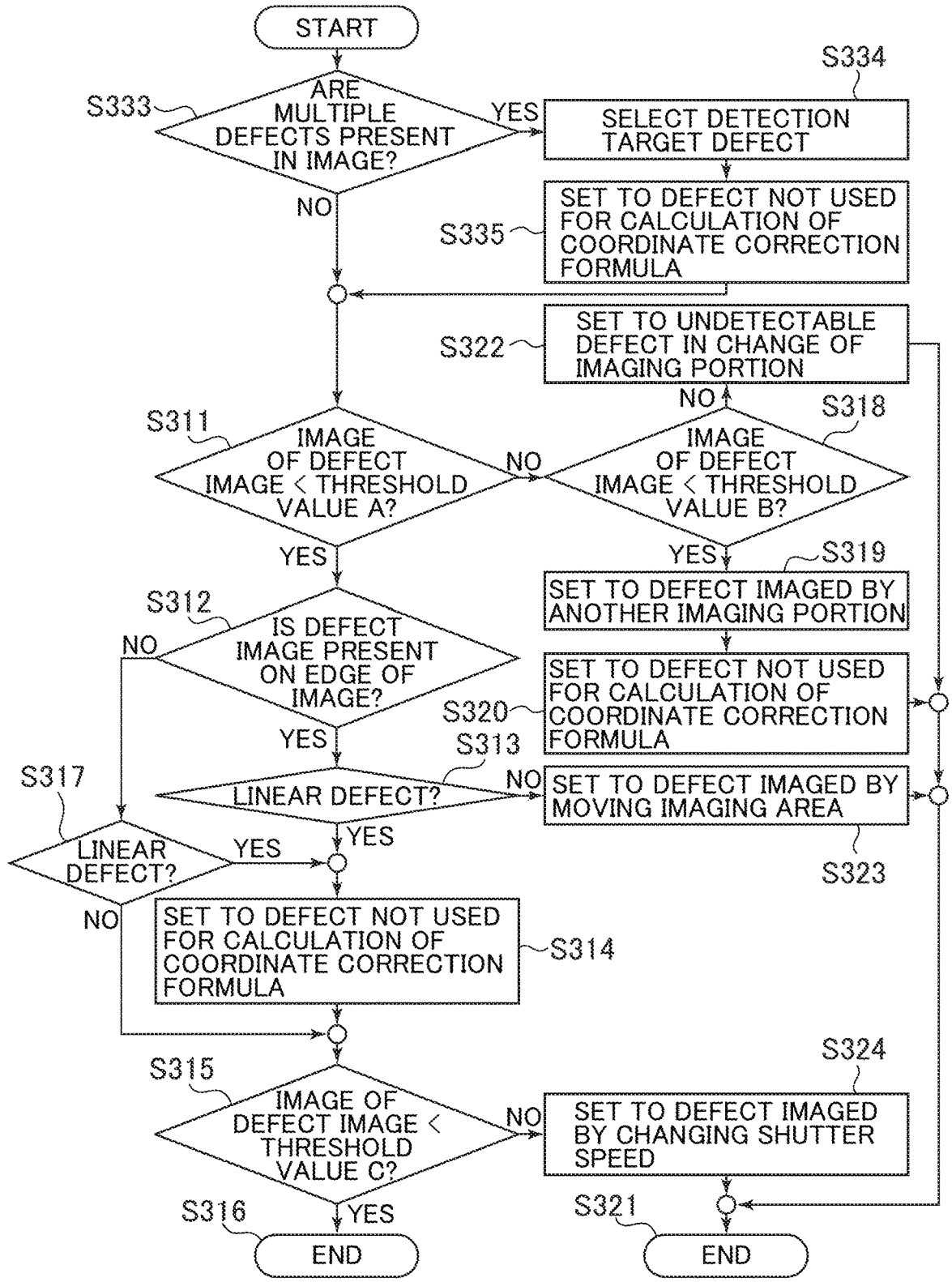
FIG. 8 is a flowchart showing a flow of a defect calculation possibility determination process according to the first embodiment.

FIG. 8 shows an example of a process of determining whether or not the defect coordinates can be calculated in S304 (FIG. 2) in consideration of a case where the multiple defect images are present in the image.

A detailed description of the same S number as that in FIG. 4 will be omitted. When determining whether or not the defect coordinates can be calculated, it is first determined whether or not multiple defects are present in the image acquired in S301 (S333). If the number of defect images in the captured image is one, the process proceeds to S311, and the same processing as that in FIG. 4 is performed.

On the other hand, if there are the multiple defects in the captured image (YES in S333), a target defect for detecting the defect coordinates is selected (S334). The number of defects selected at this time may not be one. When the multiple defects are selected, the order of calculating the defect coordinates is set in S334. Next, the detection target defect in the image is set as a defect not used for calculating the coordinate correction formula (S335), and hereafter, the same processing as that in FIG. 4 is performed.

Figure 9:
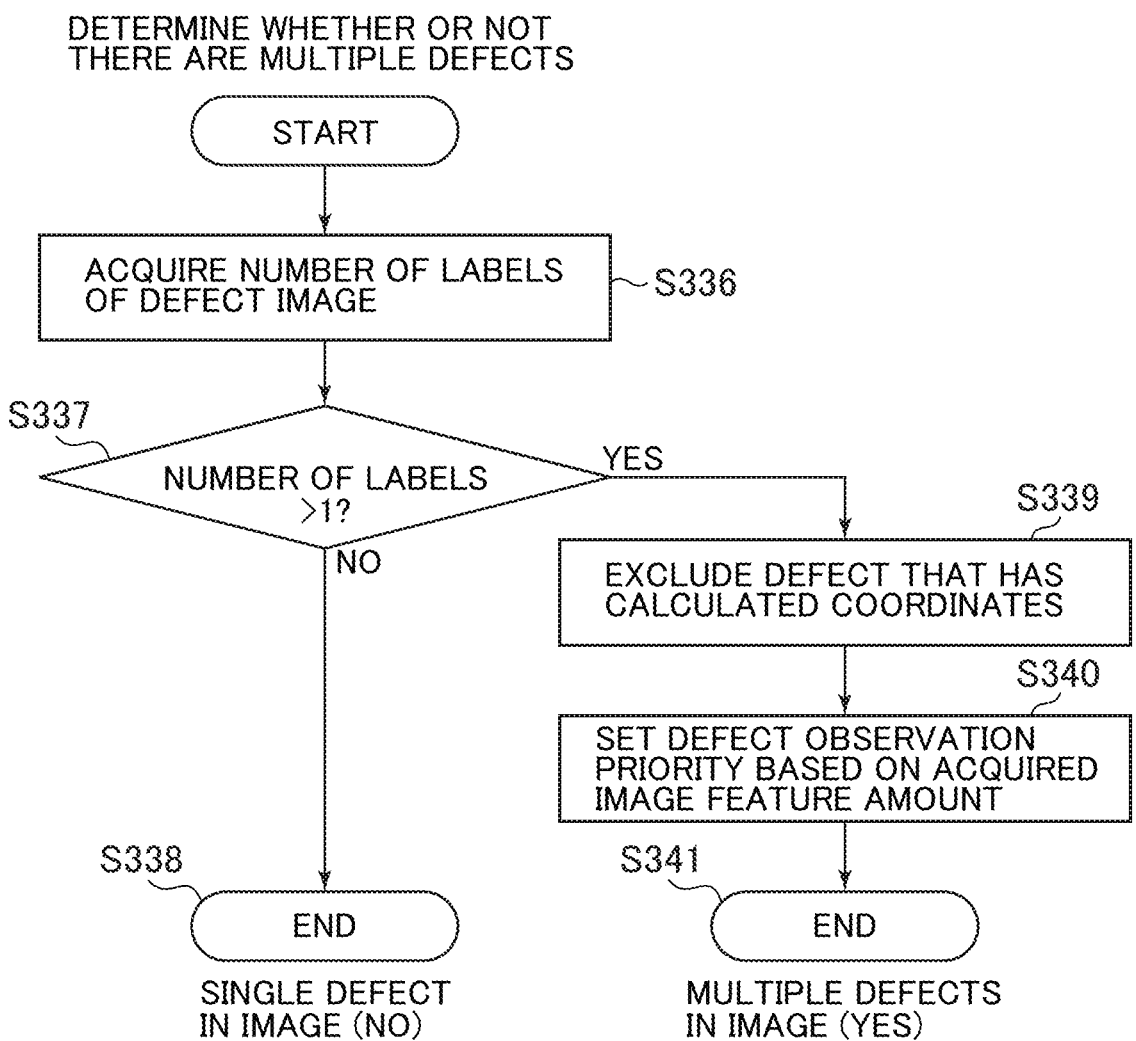
FIG. 9 is a flowchart showing a flow of a multiple-defect determination process according to the first embodiment.

FIG. 9 shows an example of a process of determining whether or not multiple defects are present in the image of S333 (FIG. 8).

The number of labels of the defect image in the image acquired in S302 (FIG. 2) is acquired (S336). If the acquired number of labels is more than 1 (YES in S337), the defects whose coordinates have already been calculated are excluded from the defect image in the image (S339). Next, a priority order to calculate the defect coordinates is set from the remaining excluded defects based on the acquired image feature amount (S340). The image feature amount is, for example, the defect area S in the image, the defect luminance $I_{max}$, the defect coordinates, and the like.

For example, there is a method of ranking the defect coordinate calculation priority order from a defect large in defect area to a defect small in defect area, from a defect high in defect luminance to a defect low in defect luminance, or from a defect close to an image center to a defect far from the image center. It is conceivable that a method of determining the maximum number of defects for calculating the defect coordinates and the defect coordinate calculation priority order may be set in advance by an inspection recipe or the like when the multiple defects are present in the image.

An example of a flow of processing the multiple defects described above with reference to FIG. 8 will be described with the use of the image 511 of FIG. 5.

The image 511 shows a captured image in which three defect images 562, 563, and 564 are present. The defect image 562 is a defect image in which the defect area S is equal to or less than the threshold value C and the defect area is not present on the edge of the image. The defect image 563 is a linear defect image in which the defect area S is equal to or less than the threshold value C and the defect region is present on the edge of the image. The defect image 564 is a defect image in which the defect area S is equal to or less than the threshold value A and more than the threshold value C, and the area of the defect image is present on the edge of the image. An example in which the priority of calculation of the defect coordinates is set to be higher for the defect closer to the image center will be described. The defect image 563 is set such that the defect coordinates of the image 563 has already been calculated.

Since there are three defect images in the image 511, the number of labels of the defect image acquired in S302 is 3. For that reason, the image 511 becomes YES in S336 and S337. Then, since the defect image 562 whose defect coordinates have already been calculated is excluded (S339), and the priority is set to be higher in order from the defects having the defect coordinates close to the center of the image, the defect priority image 562 is set to the first priority and the defect image 564 is set to the second priority (S340). Then, it is determined that the multiple defects are present in the image (YES) (YES in S341 and S333). The defect image 562 is selected for the detection target defect (S334), and then the defect image 562 is set as the defect not used for calculation of the coordinate correction formula (S335).

After that, the same processing as that of the defect image 555 in the image 503 is performed, and the defect coordinates are acquired (S305) and stored (S306). When the defect coordinates of both of the defect image 562 having the first priority and the defect image 564 having the second priority are acquired, both of the defect image 562 and the defect image 564 are set as the detection target defects (S334) and are set as the defects not used for calculation of the coordinate correction formula (S335). The defect coordinates of the defect image 564 are calculated after the defect coordinates of the defect image 562 have been calculated.

Next, the creation and updating processing of the coordinate correction formula used for calculating the imaging area of the SEM 106 in the defect observation device 1000 will be described with reference to FIG. 10.

When a large number of observation target defects exist, it takes time to observe the defects when all of the observation target defects are imaged with the optical microscope and the defect coordinates are calculated. As a method of shortening the defect observation time, there is a method of using the coordinate correction formula for correcting the defect coordinates output by the defect inspection device 107 to the coordinates in the defect observation device 1000. First of all, several defects are imaged with the optical microscope from the multiple observation target defects, and the coordinate correction formula taking a coordinate dependency within the sample 101 into consideration is created according to the calculated defect coordinates and a coordinate offset amount with respect to the defect inspection device 107.

Thereafter, the imaging area of the SEM 106 is set based on the created coordinate correction formula, thereby being capable of performing the SEM imaging without redetecting the defect with the optical microscope. The defect coordinate offset amount is calculated according to the image captured by the SEM 106 and the coordinate correction formula is updated with the use of the result. The update of the coordinate correction formula is not limited to the SEM 106 and the defect detection results of the optical microscopes 105 to 305 may be used.

When the coordinate correction formula using the defect detection results of the optical microscopes are created or updated, it is first determined whether or not the corresponding defect can be used for creating or updating the coordinate correction formula (S342). When the corresponding defect can be used for creating or updating the coordinate correction formula (YES in S342), the defect coordinates based on the output result of the defect inspection device 107 and the coarse alignment result performed on the defect observation device 1000 and the defect coordinates of the optical microscope are acquired (S343), the offset amount of the detection defect coordinates between the defect inspection device 107 and the defect observation device 1000 is calculated (S344), and the coordinate correction formula is created or updated (S345). On the other hand, in the case of the defect that cannot be used for creating or updating the coordinate correction formula (NO in S342), the processing is terminated. There are a large defect, a linear defect, multiple defects existing in a field of view of imaging, and the like as the defects not used for calculation of the coordinate correction formula.

FIG. 11 shows an example of a GUI screen displayed on the user interface 123 in order to set the defect observation condition. A device operator sets the defect observation condition in advance with the use of a GUI screen 701 shown in FIG. 11 before the defect observation.

The GUI screen 701 in FIG. 11 includes a high-precision alignment setting unit 702 for setting whether or not to perform the defect detection using the optical microscope, an imaging configuration selection unit 703 for setting the imaging configuration of the optical microscope used for defect detection, a coordinate correction formula setting section 704 for setting the conditions for creating the coordinate correction formula, an initial imaging condition setting unit 705 for setting the initial imaging conditions of various imaging configurations in the defect observation device 1000, and an automatic setting parameter selection unit 706 for selecting the imaging conditions automatically set based on the feature amount acquired in S302 when the target defect image is again acquired.

The high-accuracy coordinate alignment setting unit 702 can select whether the defect detection using the optical microscope is performed (effective) or not (ineffective).

The imaging configuration of the optical microscope used for the high-precision coordinate alignment can be selected in the imaging configuration selection unit 703. In the GUI screen 701, whether each of the imaging configuration A (optical microscope 305) and the imaging configuration B (optical microscope 105) is used (effective) or not (ineffective) can be set. In addition, when the imaging configuration B capable of setting the multiple illumination modes is set to be effective, the illumination mode to be used can be set. In the GUI screen 701, one or both of the laser illumination optical system 201 (laser) and the white illumination optical system 212 (white light source) can be selected.

The coordinate correction formula setting unit 704 selects whether the coordinate correction formula is created (effective) or not (ineffective). In addition, a sampling method for selecting the defect used for creating and updating the coordinate correction formula from the multiple target defects on the sample 101 can be set. The sampling method includes, for example, a method using the coordinates on the sample 101 or a defect size output from the defect inspection device. The coordinate correction formula setting unit 704 can select the defect not used for creating and updating the coordinate correction formula. In the GUI screen 701, the size of the large defect to be excluded from the creation of the coordinate correction formula can be set. The imaging configuration for acquiring the image for calculating the defect coordinates of the target defect on the defect observation device 1000, which is required for creating and updating the coordinate correction formula may be any one of the optical microscopes 105 and 305, and the SEM 106, or the combination of those components 105 and 305, and 106.

The initial imaging condition setting unit 705 and the automatic setting parameter selection unit 706 display setting screens for individually setting the imaging conditions of the main imaging configurations by tabs, and click on each tab of each main imaging configuration so as to be able to set the imaging conditions individually. The GUI screen 701 shows an example in which the imaging condition in the case of using the laser illumination 201 in the optical microscope 105 is set by a "configuration B laser" tab, the imaging condition in the case of using the white illumination 212 in the optical microscope 105 is set by a "configuration B white light source" tab, the imaging condition of the optical microscope 305 is set by a "configuration A" tab, and the imaging condition of the SEM is set by an "SEM" tab. The setting screens can be called up by clicking the respective tabs. The GUI screen 701 shows an example in which the "laser" tab is selected.

According to the first embodiment, in the defect observation device 1000 having the multiple imaging portions mounted thereon, a time required for acquiring the captured image of the optical microscope suitable for the defect detection is shortened by automatically selecting a next imaging configuration and setting the imaging condition based on the information obtained from the image acquired by a previous imaging portion, thereby being capable of shortening the entire time required for defect observation.

Second Embodiment

Figure 12:
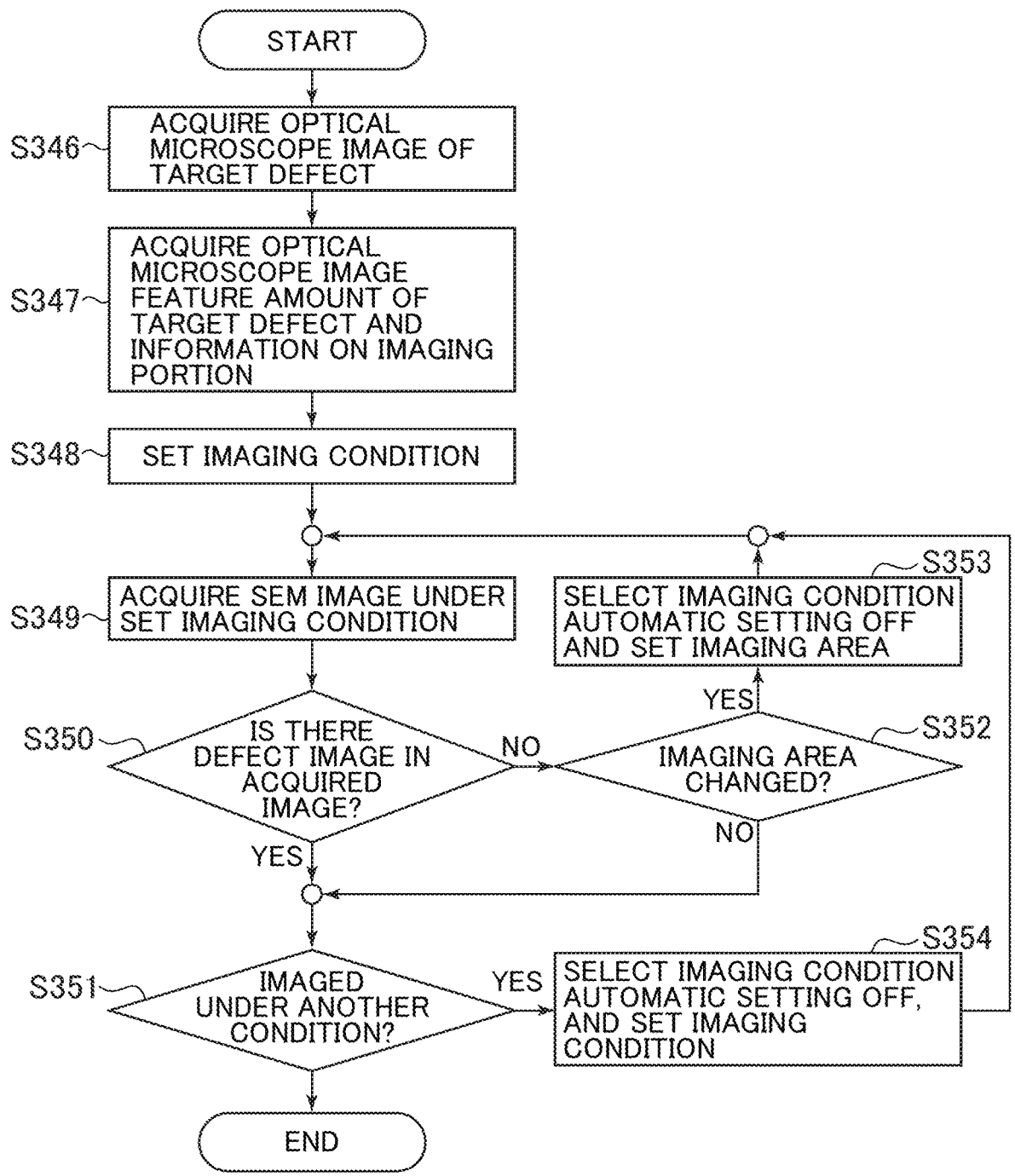
FIG. 12 is a flowchart showing a flow of a defect observation process according to a second embodiment.

FIG. 12 is a flowchart for acquiring an optical microscope image and acquiring a defect with the use of an optical microscope 105 or 305, and for acquiring an SEM image with the use of an SEM 106 according to a second embodiment. A configuration of a defect observation device 1000 according to the second embodiment is identical with that in FIG. 11, and therefore a description of the defect observation device 1000 will be omitted.

A target defect on a sample 101 placed in the defect observation device 1000 is imaged by an optical microscope in the same process as that in the first embodiment to acquire an image (S346). The optical microscope image acquired at this time may be an optical microscope image finally acquired when imaging is performed while imaging portions are changed multiple times in the processing flow of FIG. 2. Then, the image feature amount, information on the imaging portions and information at the time of imaging when the optical microscope image has been acquired is acquired from the acquired image (S347).

The information at the time of imaging includes, for example, information on "not used for calculation of a coordinate correction formula", "whether or not multiple defects are present in the image", "whether the defect is a linear defect, or not", and so on, which are determined at the time of determining whether the defect coordinates can be calculated or not, in FIG. 8. The information on the imaging portion is an imaging configuration and imaging conditions of the imaging configuration as in the first embodiment. The imaging conditions are, for example, information on the type of an illumination light source, a shutter speed and a gain of a detector, ON or OFF of an optical filter, and so on. The type of the illumination light source includes, for example, a laser illumination optical system 201 or a white illumination optical system 212.

The imaging conditions of the SEM 106 are set (S348) and an SEM image is acquired (S349) based on the information (S347) obtained by the defect imaging of the optical microscope described above. The imaging conditions of the SEM set in S348 include, for example, imaging area coordinates of the SEM, an imaging magnification, an imaging field of view, the number of frames, an acceleration voltage, a probe current, and so on. When the defect image is present in the acquired SEM image (YES in S350) and imaging is not performed under another SEM imaging condition (NO in S351), the SEM observation of the defect is terminated.

On the other hand, when re-imaging is performed under another SEM imaging condition (YES in S351), an automatic setting mode OFF of the SEM imaging condition is selected and the preset SEM imaging condition is set to a next imaging condition (S354). The process returns to the procedure (S349) for acquiring the SEM image described above, and the process proceeds.

When there is no defect image in the acquired SEM image (NO in S350), an imaging area of the SEM is changed to select whether or not to re-image (S352). When the imaging area is changed (YES in S352), the automatic setting mode OFF of the SEM imaging condition is selected, the imaging area shifted from a current imaging area in a preset distance and direction is set (S353), the process returns to a procedure of acquiring the SEM image described above (S349), and the process proceeds. On the other hand, when the imaging area is not changed (NO in S352), the process returns to a determination (S351) as to whether or not to re-image under another different condition described above, and the process is proceeded below.

Figure 13:
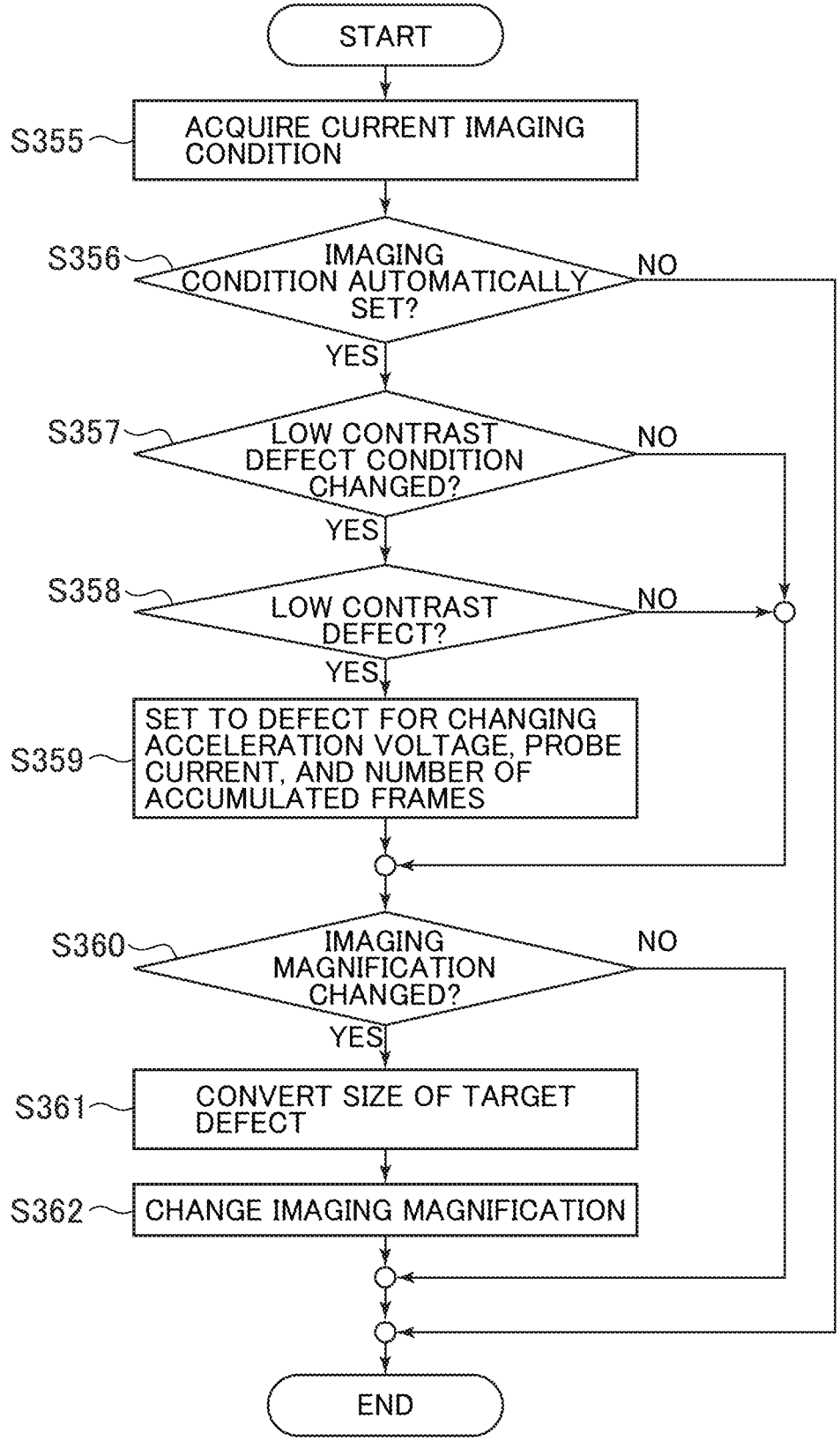
FIG. 13 is a flowchart showing a flow of an imaging condition setting process of an SEM according to the second embodiment.

FIG. 13 shows an example of processing for automatically setting the SEM imaging condition in S348 (FIG. 12). The SEM imaging condition to be automatically set is set in advance with a recipe.

First, the current imaging condition is acquired (S355). The current imaging condition is, for example, an initial imaging condition set in advance with a recipe or the imaging condition re-set in S353 or S354 in FIG. 12. When the automatic setting mode of the condition is ON (YES in S356) and the SEM imaging condition change setting of a low contrast defect is ON (YES in S357), it is determined whether or not the target defect is the low contrast defect (S358).

If the target defect is the low contrast defect (YES in S358), the target defect is set to a defect for changing any one or a combination of an acceleration voltage, a probe current, and the accumulated frame number (S359). Further, when the automatic setting of an imaging magnification is ON (YES in S360), an estimated value of the size of the target defect is calculated based on the information obtained in S347 (S360), and the imaging magnification is changed so as to match the estimated size (S361). When the automatic setting of the imaging magnification is OFF (NO in S360), the SEM imaging condition setting is terminated with the magnification of the initial imaging condition remaining unchanged.

When the target defect is not the low contrast defect (NO in S358) although the SEM imaging condition change setting of the low contrast defect is ON (YES in S357), or when the SEM imaging condition change setting of the low contrast defect is OFF (NO in S357), the process returns to the above-described imaging magnification setting procedure (S360) with the acceleration voltage and the number of frames maintained as initial conditions, and the process proceeds below. When the automatic setting mode of the imaging condition is OFF (NO in S356), the SEM imaging condition setting is ended without changing from the current imaging condition.

The low contrast defects include, for example, defects with gently changing shapes such as low step convex defects and concave defects, shallow scratch defects, and so on. In the case of the low contrast defects, for example, the acceleration voltage under the SEM imaging conditions is lowered, and the number of accumulated frames is increased.

According to the second embodiment, in the defect observation device 1000 having the multiple imaging portions mounted thereon, a time required for acquiring the captured image of the SEM 106 suitable for the defect detection is shortened by automatically selecting a next imaging configuration and setting the imaging condition based on the information obtained from the image acquired by a previous imaging portion, thereby being capable of shortening the entire time required for defect observation.

Third Embodiment

Figure 14:
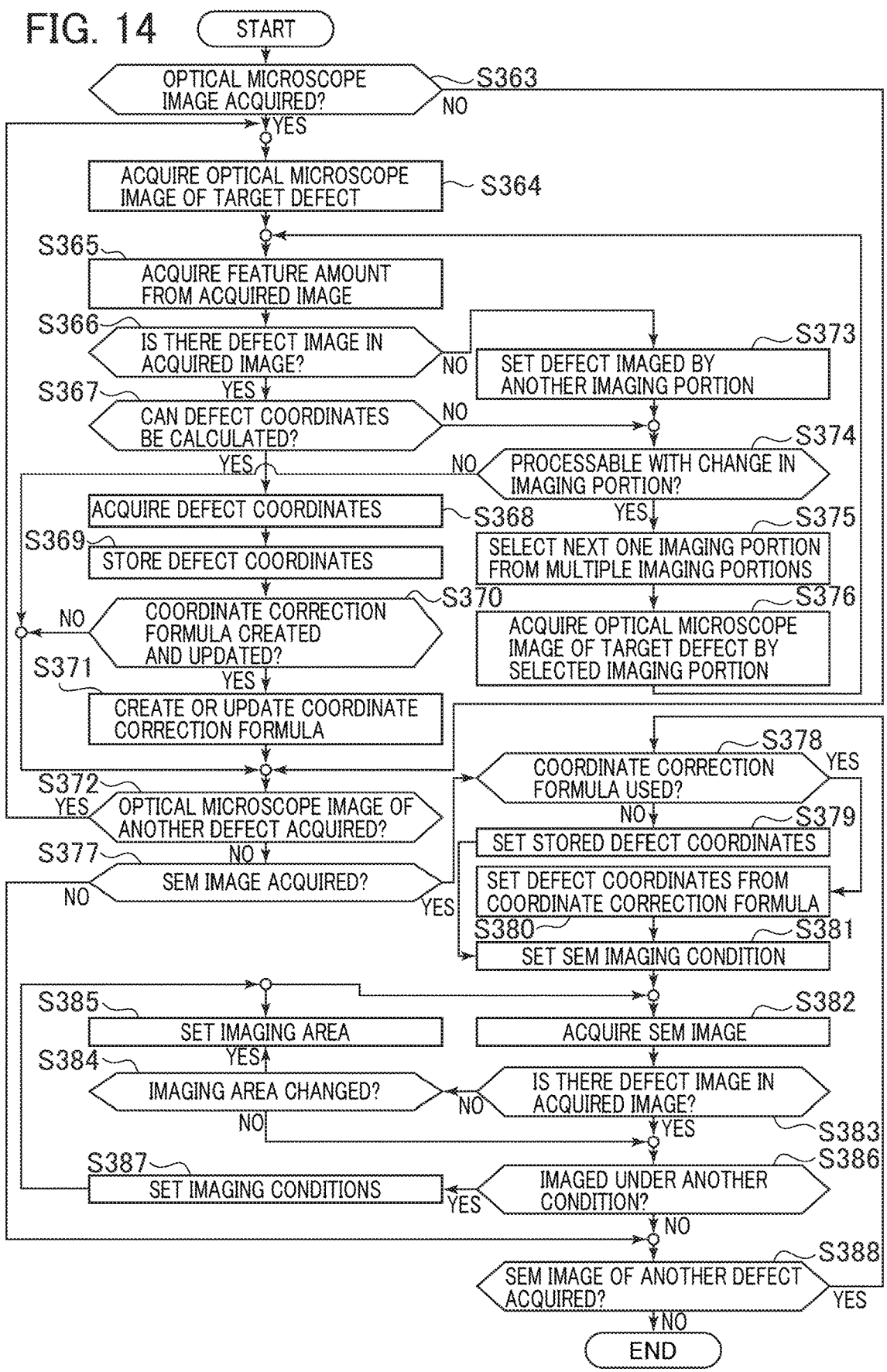
FIG. 14 is a flowchart showing a flow of a defect observation process according to a third embodiment.

FIG. 14 is a flowchart from defect detection by an optical microscope to an SEM image acquisition by an SEM 106 according to a third embodiment. Since a configuration of a defect observation device 1000 according to the third embodiment is the same as that in FIG. 1, a description of the defect observation device 1000 will be omitted. With the same processing as that in the first embodiment, a sample 101 is placed in the defect observation device 1000, and coarse alignment of the sample is performed in advance.

First, it is determined whether or not to acquire an optical microscope image of a target defect (S363). If the optical microscope image is not acquired (NO in S363), the process proceeds to a next step (S372). A case where no optical microscope image is acquired includes, for example, a case where the optical microscope image has already been acquired for some defects, and a coordinate correction formula with high precision can be created.

On the other hand, when the optical microscopic image of the target defect is acquired (YES in S363), the optical microscope image of the target defect is acquired (S364) and an image feature amount is acquired from the acquired optical microscope image (S365). If there is a defect image in the optical microscope image (YES in S366), then it is determined whether defect coordinates can be calculated or not (S367). In the processing flow of S367, the determination may be performed in the same procedure as that in the processing flow of FIG. 4 or the processing flow of FIG. 8.

If the defect coordinates can be calculated (YES in S367), defect coordinates are acquired from S365 (S368) and stored (S369). Further, a case where the acquired defect coordinates are used for creating or updating the coordinate correction formula is determined based on the processing result in S367 (S370). A method of creating and updating the coordinate correction formula may be performed in the dame procedure as that in FIG. 10. When the coordinate correction formula is created or updated with the use of the defect coordinates stored in S369 (YES in S370), the coordinate correction formula is created or updated (S371), and the process proceeds to a next Step (S372). When the detected defect coordinates are not used for creating or updating the coordinate correction formula (NO in S370), the process proceeds to a next step as it is (S372).

If there is a defect image in the optical microscope image acquired in S364 (YES in S366), but the defect coordinates can be hardly calculated (NO in S367) and a next imaging portion can be set (YES in S374), the next imaging portion is selected (S375), and the optical microscope image is acquired by the selected imaging portion (S376). Thereafter, the process again returns to a procedure of the defect detection (S365), and the process proceeds. If the imaging portion cannot be set by the optical microscope (NO in S374), the process proceeds to a next step (S372) without any defect detection. In addition, if there is no defect image in the optical microscope image acquired in S364 (NO in S366), the defect is set to a defect imaged by another imaging portion (S373), the process proceeds to a procedure of reimaging (S374), and the processing is performed in the same manner as that described above.

Next, it is determined whether or not there is another defect that is the optical microscope image acquisition target (S372). If there is another target defect (YES in S372), the process again returns to the procedure (S364) for acquiring the optical microscope image and the process proceeds. When there is no defect that is the optical microscope image acquisition target (NO in S372), the process proceeds to the SEM imaging procedure (S377).

In the case of acquiring the SEM image of the target defect (YES in S377), it is set whether the imaging area of the SEM is determined with the use of the coordinate correction formula created and updated in S371 (S378). When the defect coordinates of the target defect are stored in S369 through the processing described above, the SEM imaging area is set based on the defect coordinates stored in S369 without using the coordinate correction formula (NO in S378) (S379). Then, the SEM imaging condition is set based on the information acquired in S364 and S365 (S381). The SEM condition setting in S381 may be performed in the same procedure as that in FIG. 13.

In addition, the information acquired in S364 and S365 includes, for example, the image feature amount obtained from the image acquired in S364, the imaging configuration information and the imaging condition when acquiring the optical microscope image, and information at the time of imaging. The information at the time of imaging is, for example, information indicating "not used for calculation of the coordinate correction formula", "whether or not the multiple defects are present in the image", "whether or not the defect is a linear defect", and so on.

As in the first embodiment, the imaging conditions are, for example, information on the type of an illumination light source, a shutter speed and a gain of the detector 207, ON or OFF of the optical filter 205, and so on. The type of the illumination light source includes, for example, the laser illumination optical system 201 or the white illumination optical system 212. The imaging conditions of the SEM set in S381 are, for example, the imaging magnification, the number of frames, the acceleration voltage, and so on. On the other hand, if the target defect is not the defect stored in the defect coordinates, the SEM imaging area is set (S380) with the use of the coordinate correction formula (YES in S378). Then, the SEM imaging conditions are set (S381).

Next, the imaging area set in S379 or S380 is imaged under the SEM imaging condition set in S381 to acquire the SEM image (S382). If there is a defect image in the acquired SEM image (YES in S382) and the defect is not imaged under another SEM imaging condition (NO in S386), the SEM observation of the target defect is ended. If there is another SEM observation target defect (YES in S388), the process returns to the SEM image acquisition procedure (S378), and the process proceeds. If there is no SEM image target defect (NO in S388), the SEM observation is ended.

In S386, in the case of re-imaging under another SEM imaging condition (YES in S386), a next imaging condition is set (S387), and the process returns to the SEM image acquisition procedure (S382), and the process proceeds.

If there is no defect image in the SEM image acquired in S382 (NO in S383), the imaging area is changed to select whether or not to re-image (S384). If the imaging area is changed (YES in S384), a next imaging area is set (S385), the process returns to the SEM image acquisition procedure (S382), and the process proceeds. On the other hand, if the imaging area is not changed (NO in S384), the process proceeds to a selection of whether or not to re-image under another SEM imaging condition (S386), and the same processing as that described above is performed.

Figure 15:
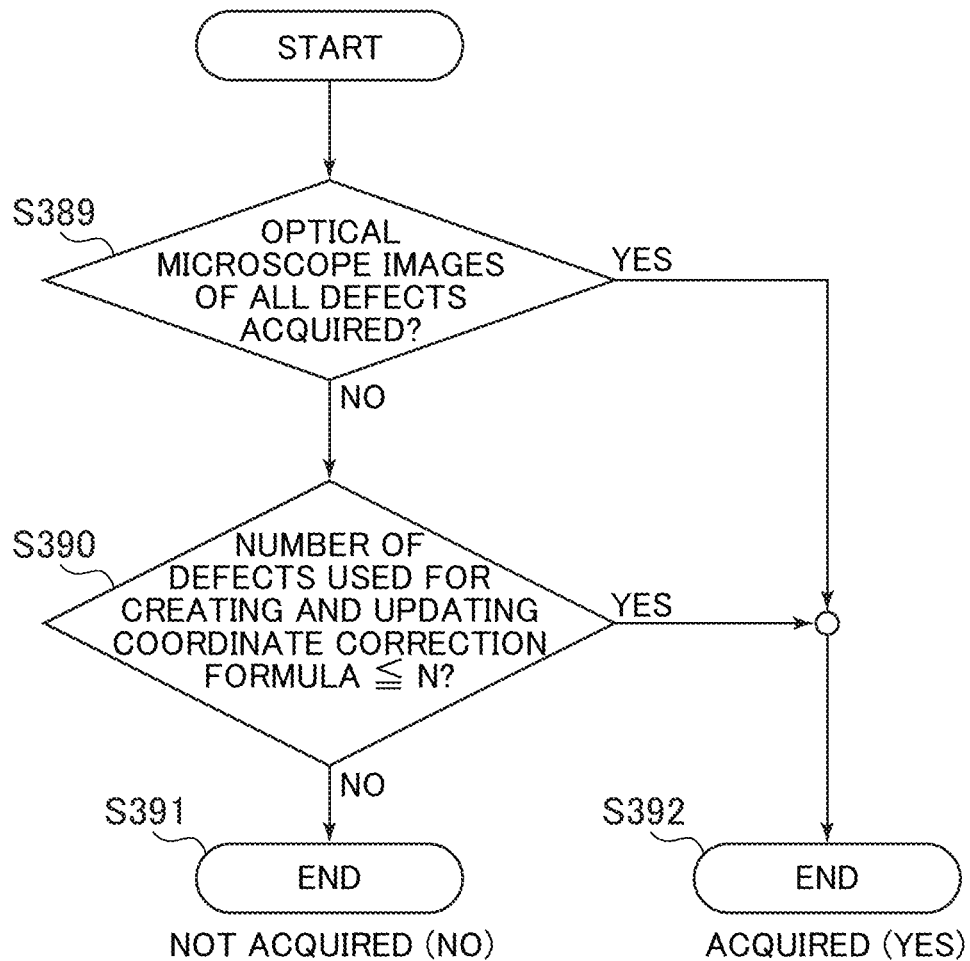
FIG. 15 is a flowchart showing a flow of an image acquisition necessity determination process of an optical microscope according to a third embodiment.

FIG. 15 shows an example of processing for determining the necessity of acquiring the optical microscope image in S363 (FIG. 14).

First, it is selected whether or not to acquire the optical microscope images for all of the defects to be observed based on the information set in advance in the recipe (S389). In the case of acquiring the optical microscope images of all defects (YES in S389), it is determined to acquire the optical microscope image of the current target defect (YES) (S392). On the other hand, if the optical microscope image of a part of the defect to be observed is acquired (NO in S389), the optical microscope image of the current target defect is acquired (YES) until the number of defects which can be used for creating or updating the coordinate correction formula reaches a preset threshold value N (YES in S390) (S392). After reaching the preset threshold value N (NO in S390), it is determined that the optical microscope image of the current target defect is not acquired (NO) (S391).

According to the third embodiment, in the defect observation device 1000 equipped with the multiple imaging portions, an entire time required for the defect detection can be reduced by automatically selecting the next imaging configuration and setting the imaging condition based on the information obtained from the image acquired by the previous imaging portion.

Although the invention made by the present inventors has been described specifically based on the embodiments, the present invention is not limited to the above-described embodiments, and various modifications can be made without departing from the spirit of the invention. For example, although the above description is limited to an example of acquiring the SEM image as an image for the purpose of defect observation, the image for the purpose of the defect observation is not limited to the SEM image, and an optical microscope image with high magnification may be acquired.

What is claimed is:

1. A defect observation device comprising:
a first imaging unit that captures a plurality of defects detected by an external inspection device;
a control unit that corrects positional information on the defects by using an image captured by the first imaging unit; and
a scanning electron microscope configured with a second imaging function and comprising a second imaging unit that captures the defects based on the corrected position information,
wherein the first imaging unit includes a plurality of imaging portions,
the control unit selects one of the first imaging unit and the second imaging unit as a next imaging unit for each of the defects based on the information obtained by imaging the defect by the first imaging unit,
the control unit sets a next imaging portion of the first imaging unit from the plurality of imaging portions in the first imaging unit or an imaging condition of the second imaging unit,
the control unit sets an accumulation frame number, an acceleration voltage, a probe current, an imaging magnification or an imaging field of view as the imaging condition of the second aging unit, and
the control unit calculates a coordinate correction formula based on the positional information of the defect detected by the first imaging unit and the information obtained by an image acquired by the first imaging unit, and images the defect by using the second imaging unit based on the corrected positional information.

2. A defect observation device comprising:
a first imaging unit that captures a plurality of defects detected by an external inspection device;
a control unit that corrects positional information on the defects by using an image captured by the first imaging unit; and
a scanning electron microscope configured with a second imaging function and comprising a second imaging unit that captures the defects based on the corrected position information,
wherein the first imaging unit includes a plurality of imaging portions,
when it is determined that coordinate detection of the defect from the image captured by the first imaging unit is disabled, the control unit sets a next imaging portion of the first imaging unit from the plurality of imaging portions of the first imaging unit based on the information obtained by the image acquired by the first imaging unit of the imaging portion determined to be incapable of detecting the coordinates of the defect, and
the control unit calculates a coordinate correction formula based on the positional information of the defect detected by the first imaging unit and information obtained by the image acquired by the first imaging unit, and images the defect by using the second imaging unit based on the corrected positional information.

3. The defect observation device according to claim 2, wherein the information obtained by the image acquired by the first imaging unit of the imaging portion, which is determined to be incapable of detecting the coordinates of the defect, includes:
information on the imaging portions of the first imaging unit;
an image feature amount obtained from the image captured by the first imaging unit; and
determination information on a defect image determined based on the information of the imaging portions and the image feature amount.

4. The defect observation device according to claim 3, wherein the determination information of the defect image includes determination information as to whether or not an area of the defect image in the image captured by the first imaging unit is on an edge of the captured image.

5. The defect observation device according to claim 3, wherein the determination information of the defect image includes determination information as to whether or not the defect image in the image captured by the first imaging unit is linear.

6. The defect observation device according to claim 3, wherein the determination information of the defect image includes determination information as to whether or not a plurality of the defect images are present in the image captured by the first imaging unit.

7. The defect observation device according to claim 3, wherein the determination information on the defect image includes determination information on a size of the defect image in the image captured by the first imaging unit.

8. The defect observation device according to claim 3, wherein the control unit calculates the coordinate correction formula based on a detection result of the defect selected based on the determination information of the defect image.

9. The defect observation device according to claim 1, wherein the information obtained by the image acquired by the first imaging unit includes:
   information on the imaging portions of the first imaging unit,
   an image feature amount obtained from the image captured by the first imaging unit, and
   determination information on a defect image determined based on the information of the imaging portions and the image feature amount.

10. The defect observation device according to claim 9, wherein the determination information of the defect image includes determination information as to whether or not an area of the defect image in the image captured by the first imaging unit is on an edge of the captured image.

11. The defect observation device according to claim 9, wherein the determination information of the defect image includes determination information as to whether or not the defect image in the image captured by the first imaging unit is linear.

12. The defect observation device according to claim 9, wherein the determination information of the defect image includes determination information as to whether or not a plurality of the defect images are present in the image captured by the first imaging unit.

13. The defect observation device according to claim 9, wherein the determination information on the defect image includes determination information on a size of the defect image in the image captured by the first imaging unit.

14. The defect observation device according to claim 9, wherein the control unit calculates the coordinate correction formula based on a detection result of the defect selected based on the determination information of the defect image.

* * * * *